US012354893B2

(12) United States Patent
Luan et al.

(10) Patent No.: US 12,354,893 B2
(45) Date of Patent: Jul. 8, 2025

(54) FIXTURE AND METHOD FOR DETERMINING POSITION OF A TARGET IN A REACTION CHAMBER

(71) Applicant: ASM IP Holding B.V., Almere (NL)

(72) Inventors: Siyao Luan, Phoenix, AZ (US); Peipei Gao, Chandler, AZ (US); Xing Lin, Chandler, AZ (US); Alexandros Demos, Scottsdale, AZ (US); Kishor Patil, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 580 days.

(21) Appl. No.: 17/549,311

(22) Filed: Dec. 13, 2021

(65) Prior Publication Data

US 2022/0189804 A1 Jun. 16, 2022

Related U.S. Application Data

(60) Provisional application No. 63/126,176, filed on Dec. 16, 2020.

(51) Int. Cl.
*H01L 21/67* (2006.01)
*C23C 16/455* (2006.01)
*C23C 16/458* (2006.01)
*C23C 16/52* (2006.01)
*H01L 21/687* (2006.01)

(52) U.S. Cl.
CPC ...... *H01L 21/67259* (2013.01); *C23C 16/455* (2013.01); *C23C 16/4582* (2013.01); *C23C 16/52* (2013.01); *H01L 21/68742* (2013.01)

(58) Field of Classification Search
None
See application file for complete search history.

(56) References Cited

U.S. PATENT DOCUMENTS

| 7,669,339 | B1 * | 3/2010 | Arnal | H01Q 1/125 33/645 |
|---|---|---|---|---|
| 9,960,072 | B2 | 5/2018 | Coomer | |
| 10,103,040 | B1 | 10/2018 | Oosterlaken | |
| 10,872,804 | B2 | 12/2020 | White | |
| 11,088,002 | B2 | 8/2021 | Pierreux | |
| 11,168,395 | B2 | 11/2021 | Sreeram | |
| 11,230,766 | B2 | 1/2022 | Pierreux | |
| 11,247,330 | B2 | 2/2022 | Yoshida | |
| 11,626,308 | B2 | 4/2023 | Ganguli | |
| 11,802,338 | B2 | 10/2023 | Huggare | |

(Continued)

FOREIGN PATENT DOCUMENTS

WO 2019003827 A1 6/2019

*Primary Examiner* — Binu Thomas
(74) *Attorney, Agent, or Firm* — Snell & Wilmer L.L.P.

(57) ABSTRACT

A fixture includes a frame, a leveling plate, a bracket, and a laser profiler. The frame is arranged for fixation above a reaction chamber arranged to deposit a film onto a substrate. The leveling plate is supported on the frame. The bracket is supported on the leveling plate. The laser profiler is suspended from the bracket, overlays the reaction chamber, and has a field of view that extends through the leveling plate and the frame to determine position of a target within the reaction chamber. Semiconductor processing systems and methods of determining position of targets within reaction chambers in semiconductor processing systems are also described.

11 Claims, 13 Drawing Sheets

(56) References Cited

U.S. PATENT DOCUMENTS

| | | |
|---|---|---|
| 2010/0124610 A1* | 5/2010 | Aikawa ............ H01L 21/67259 |
| | | 118/712 |
| 2012/0205347 A1 | 8/2012 | Jennings |
| 2012/0216413 A1* | 8/2012 | Adegawa ............ G01C 15/004 |
| | | 33/290 |
| 2014/0036274 A1* | 2/2014 | Marquardt ........ H01L 21/67259 |
| | | 356/614 |
| 2021/0280448 A1 | 9/2021 | Ganguli |
| 2021/0310123 A1 | 10/2021 | Kimtee |
| 2022/0076986 A1 | 3/2022 | Chen |
| 2022/0168787 A1 | 6/2022 | Nandwana |
| 2022/0186369 A1 | 6/2022 | Patil |
| 2022/0189804 A1 | 6/2022 | Luan |
| 2022/0243324 A1 | 8/2022 | Kim |
| 2022/0301906 A1 | 9/2022 | Naik |
| 2023/0100356 A1 | 3/2023 | Dongyang |
| 2023/0105844 A1 | 4/2023 | Dongyang |
| 2023/0184539 A1 | 6/2023 | Nandwana |
| 2023/0307269 A1 | 9/2023 | Garssen |

* cited by examiner

FIXTURE AND METHOD FOR DETERMINING POSITION OF A TARGET IN A REACTION CHAMBER

CROSS-REFERENCE TO RELATED APPLICATIONS

This application is a non-provisional of, and claims priority to and the benefit of, U.S. Provisional Patent Application No. 63/126,176, filed Dec. 16, 2020 and entitled "FIXTURE AND METHOD FOR DETERMINING POSITION OF A TARGET IN A REACTION CHAMBER," which is hereby incorporated by reference herein.

FIELD OF INVENTION

The present disclosure generally relates to semiconductor processing systems, and more particularly, to determining position of targets within reaction chambers in semiconductor processing systems.

BACKGROUND OF THE DISCLOSURE

Semiconductor processing systems are commonly used to deposit films onto substrates, such as during the fabrication of very large-scale integrated circuits or power electronics. Film deposition in such systems is generally accomplished by supporting a substrate within a reaction chamber and flowing a precursor gas through the reaction chamber to deposit a film onto the substrate. The reaction chamber typically flows the precursor gas through the reaction chamber according to a predetermined gas flow pattern during deposition of the film onto the substrate. The reaction chamber also typically maintains predetermined thermal conditions within the reaction chamber environment during deposition of the film onto the substrate.

In some film deposition techniques deviation from the predetermined gas flow pattern and/or the predetermined thermal conditions may introduce properties and characteristics in the film that differ from those intended, such as thickness variation and/or variation in the electrical properties of the deposited film. The gas flow pattern and/or thermal conditions within a particular the reaction chamber may vary, for example, according to deviation in the 'as built' positioning of certain structures within the reaction chamber in comparison to the intended position(s) of the structures within the reaction chamber. The gas flow pattern and/or thermals conditions within a reaction chamber may also vary according to deviation in the positioning of the substrate within the reaction chamber, e.g., shifts and/or decentering of the placement of the substrate on the substrate holder in advance of the deposition process. For that reason, the 'as built' performance within reaction chambers may be compared against certain process limits, and adjustments made to the reaction chamber, prior to the reaction chamber being qualified for production.

Such systems and have generally been satisfactory for their intended purpose. However, there remains a need in the art for improved fixtures, semiconductor processing systems, and methods of determining placement of targets within reaction chambers in semiconductor processing systems. The present disclosure provides a solution to this need.

SUMMARY OF THE DISCLOSURE

A fixture is provided. The fixture includes a frame, a leveling plate, a bracket, and a laser profiler. The frame is configured for fixation above a reaction chamber that is configured to deposit a film onto a substrate. The leveling plate is supported on the frame. The bracket is supported on the leveling plate. The laser profiler is suspended from the bracket, overlays the reaction chamber, and has a field of view extending through the leveling plate and the frame to determine position of a target within the reaction chamber.

In certain examples, the frame may include a first stringer, a second stringer offset from the first stringer, and two or more joists extending between the first stringer and the second stringer. The first stringer and the second stringer may longitudinally span the reaction chamber.

In certain examples, the bracket may include a U-shaped body having a lower tine connected to an upper tine by a web. The upper tine may have a profiler seat extending along the upper tine, the lower tine may have a bracket seat extending along the lower tine, and the bracket seat may extend in parallel with the profiler seat.

In certain examples, the bracket seat may abut the leveling plate and the laser profiler may be suspended from the profiler seat and above the lower tine of the U-shaped body.

In certain examples, the bracket may include an end cap. The end cap may be fixed to ends of the upper tine and the lower tine opposite the web. The end cap may have a cable passthrough. A cable may extend through the cable passthrough and be electrically connected to the laser profiler to communicate height measurements acquired by the laser profiler.

In certain examples, the fixture may include a first leveling screw and one or more second leveling screw. The first leveling screw may be threadedly received in the leveling plate and space the leveling plate apart from the frame. The one or more second leveling screw may be threadedly received in the leveling plate and space the leveling plate apart from the frame. The one or more second leveling screw may be offset from the first leveling plate on a mounting surface of the leveling plate. In certain examples the fixture may include at least three leveling screws.

In certain examples, the fixture may include a first level and a second level. The first level may extend longitudinally along a mounting surface of the leveling plate. The second level may extend laterally along the mounting surface of the leveling plate. The second level may be orthogonal relative to the first level. The first level may be fixed relative to the level plate. The second level may be fixed relative to the leveling plate.

In certain examples, the laser profiler may include a laser source, an expansion lens, collection optics, and a sensor. The expansion lens may be optically coupled to the laser source and configured to widen a beam incident upon the expansion lens into a line and project the line onto the target. The collection optics may be optically coupled to the expansion lens by the target. The sensor may be optically coupled to the collection optics and configured to determine height of the laser profiler from the target along the line.

In certain examples, the laser profiler source may include a (a) a visible laser source, (b) a blue wavelength laser source, or (c) a 405-nanometer laser source.

In certain examples, the bracket may have a bracket aperture extending therethrough, the expansion lens may be aligned between the laser source and the bracket aperture to project the line onto the target, and the collection optics may be aligned between the bracket aperture and the sensor to collect and communicate illumination reflected from the target onto the sensor.

In certain examples, the leveling plate may have one or more of a shelf mount, a one-piece ring mount, a susceptor mount, a wafer center mount, and a wafer periphery mount. The shelf mount may have a shelf mount aperture and may be configured to seat the bracket. The one-piece ring mount may be longitudinally and/or laterally offset from the shelf mount, may have a one-piece ring mount aperture, and may be configured to seat the bracket. The susceptor mount may be longitudinally and/or laterally offset from the one-piece ring mount, may have a susceptor mount aperture, and may additionally be configured to seat the bracket. The wafer center mount may be longitudinally and/or laterally offset from the susceptor mount, may have a wafer center aperture, and may also be configured to seat the bracket. The wafer periphery mount may be radially offset from the wafer center mount, may have a wafer periphery mount aperture, and may be further configured to seat the bracket.

A semiconductor processing system is provided. The semiconductor processing system includes a reaction chamber, a shelf, a one-piece ring, susceptor, and a fixture as described above. The shelf is fixed within an interior of the reaction chamber. The one-piece ring is positioned within the reaction chamber, abuts the shelf, and has a one-piece ring aperture extending therethrough. The susceptor is supported within the interior of the reaction chamber for rotation about a rotation axis that extends through the one-piece ring aperture, The frame of the fixture supports the leveling plate above the reaction chamber such that at least one of the shelf, the one-piece ring, the susceptor, or a wafer positioned between the susceptor and the leveling plate is in the field of view of the laser profiler.

A method of determining position of a target within a reaction chamber of a semiconductor processing system is provided. The method includes, at a fixture as described above, leveling the leveling plate above the reaction chamber relative to gravity, projecting a line into the reaction chamber and onto a target within the reaction chamber, and acquiring height of the laser profiler above the target at a first point and a second point along the line. The second point spaced apart from the first point along the line and position of the target within the reaction chamber is determined using height of the laser profiler above the target at the first point and the second point along the line.

In certain examples, the target may include a shelf fixed within an interior of the reaction chamber. Determining position of the target may include determining at least one of height and level of the shelf relative to the leveling plate.

In certain examples, the target may include a one-piece ring seated within the reaction chamber. Determining position of the target may include determining at least one of height and level of the one-piece ring relative to the leveling plate.

In certain examples, the target may include a susceptor supported within the reaction chamber for rotation about a rotation axis. Determining position of the target may include determining at least one of (a) height of the susceptor relative to the leveling plate, (b) level of the susceptor relative to the leveling plate, (c) centering of the susceptor relative to the one-piece ring (d) wobble of the susceptor during rotation about the rotation axis, and (e) runout of the susceptor during rotation about the rotation axis.

In certain examples, the method may include supporting a wafer on a susceptor supported within the reaction chamber or for rotation about a rotation axis and displacing the wafer from the susceptor using a plurality of lift pins translatable along the rotation axis relative to the susceptor. Projecting the line onto the target may include projecting the line onto the wafer and determining position of the target may further include identifying contact height of the plurality lift pins with the wafer prior to displacement of the wafer from the susceptor.

In certain examples, projecting the line onto the target may include projecting the line onto a center portion of the wafer and the method may further include tuning speed of movement of the plurality of lift between an extended position and a retracted position along the rotation axis during loading of wafers onto the susceptor.

In certain examples, projecting the line onto the target may include projecting the line onto a peripheral portion of the wafer and the method may further include determining level of the plurality of lift pins relative to the leveling plate using the contact height of the plurality of lift pins.

In certain examples, the contact height may be a first contact height and the method may include acquiring a second contact height of the plurality of lift pins using the laser profiler, and level of the plurality of lift pins may be determined using both the first contact height and the second contact height of plurality of lift pins.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the present disclosure are described below with reference to the drawings of certain embodiments, which are intended to illustrate and not to limit the invention.

Figure 12:
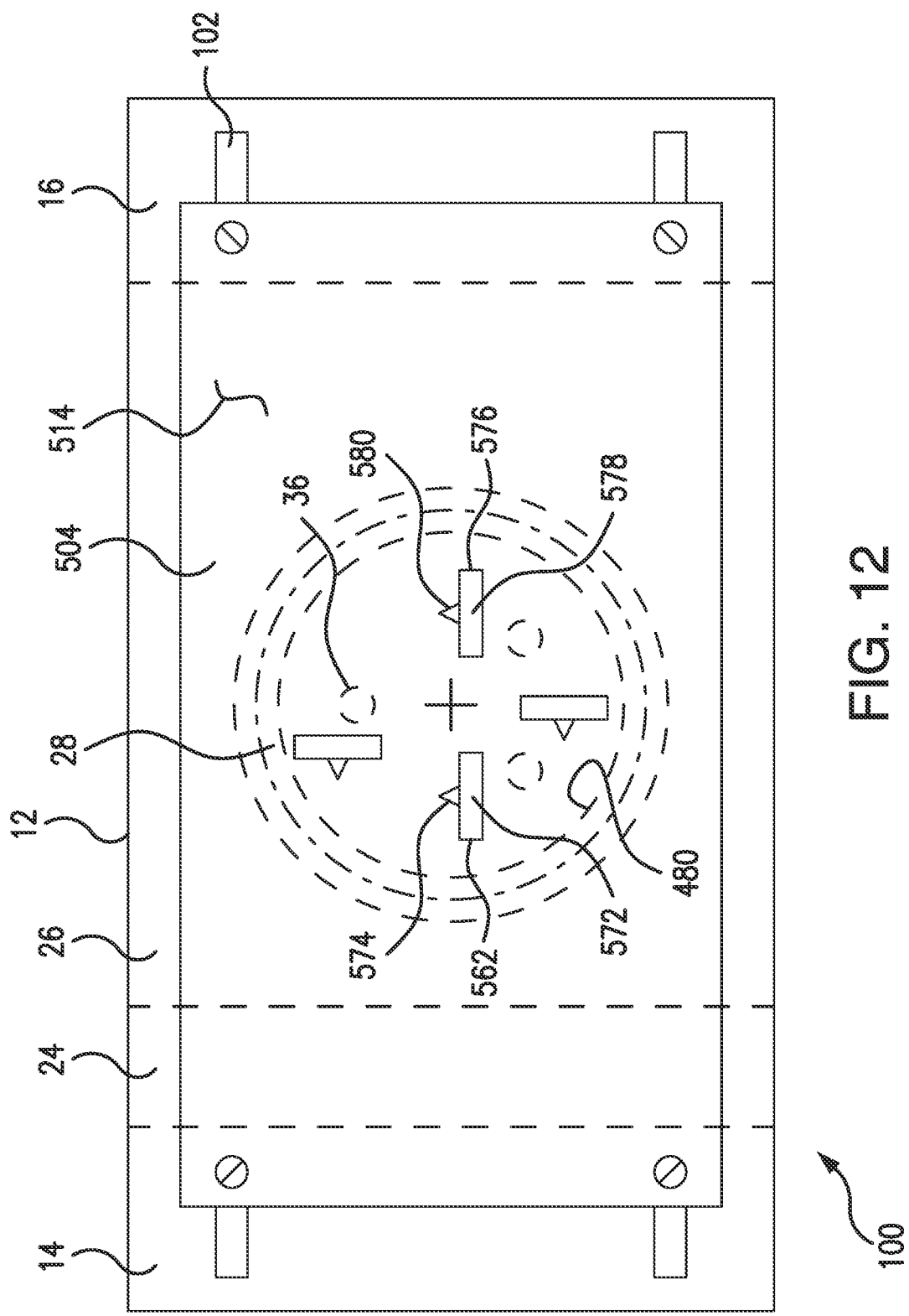
FIG. 12 is a plan view of the reaction chamber and a portion of the fixture of FIG. 1 including the leveling plate, schematically showing a wafer periphery mount located on the leveling plate and overlaying a wafer positioned within the reaction chamber.
Figure 13:
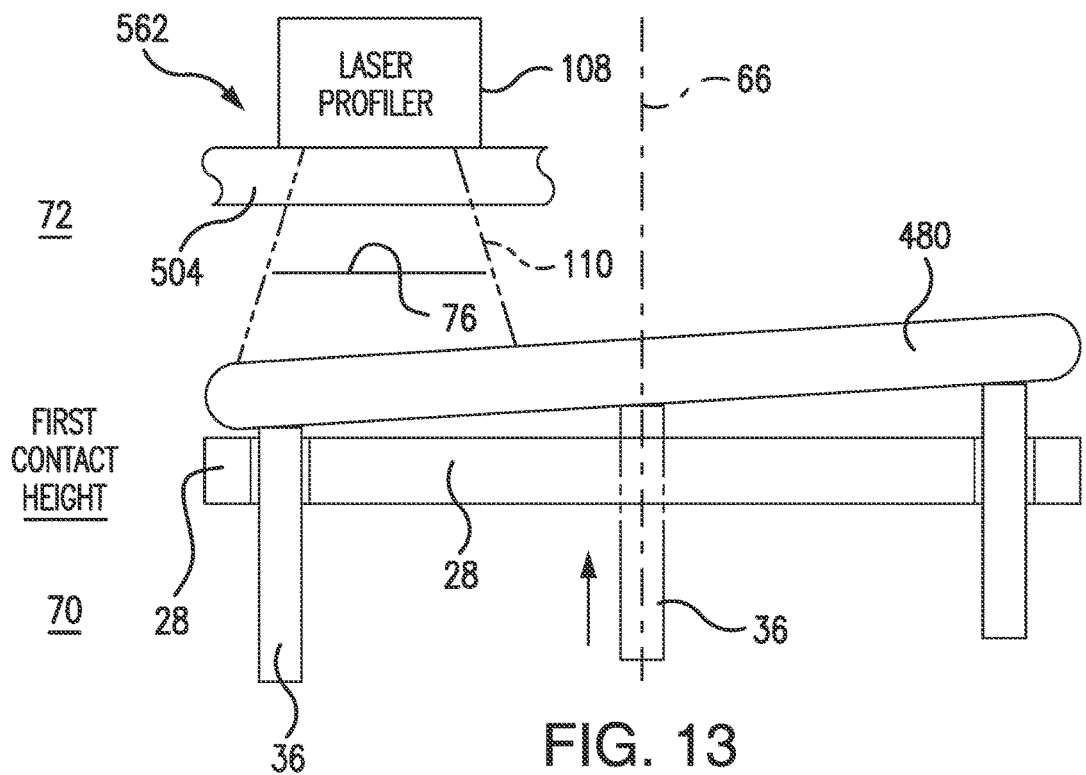
Figure 14:
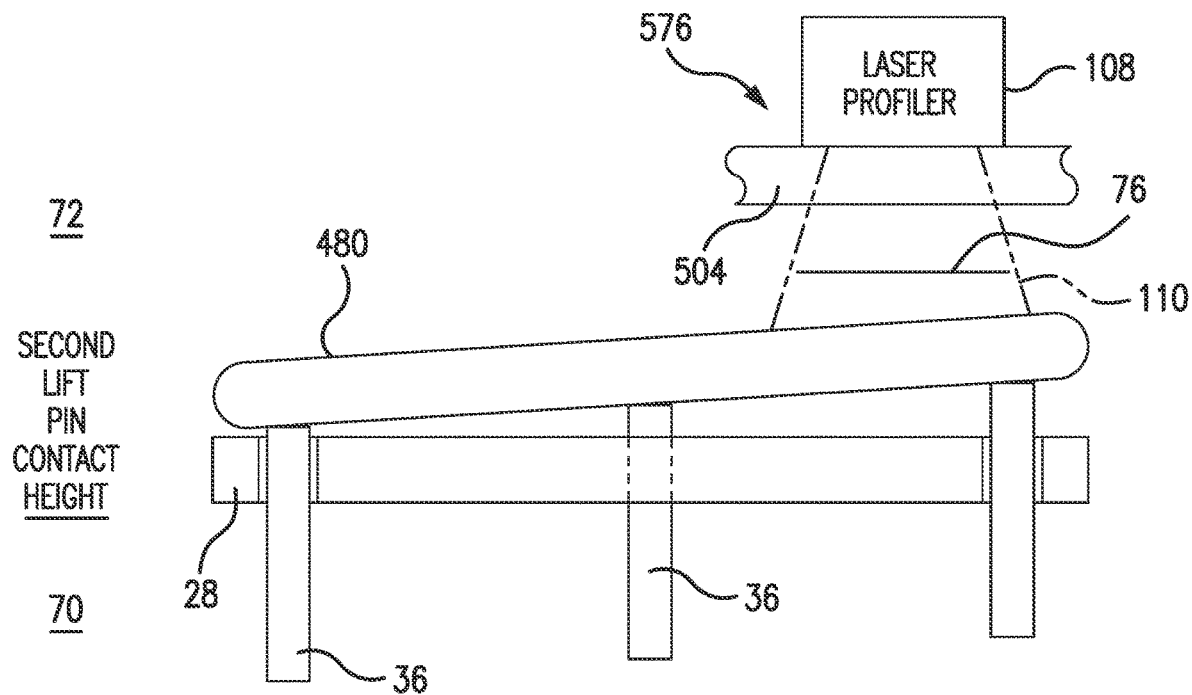
Figure 15:
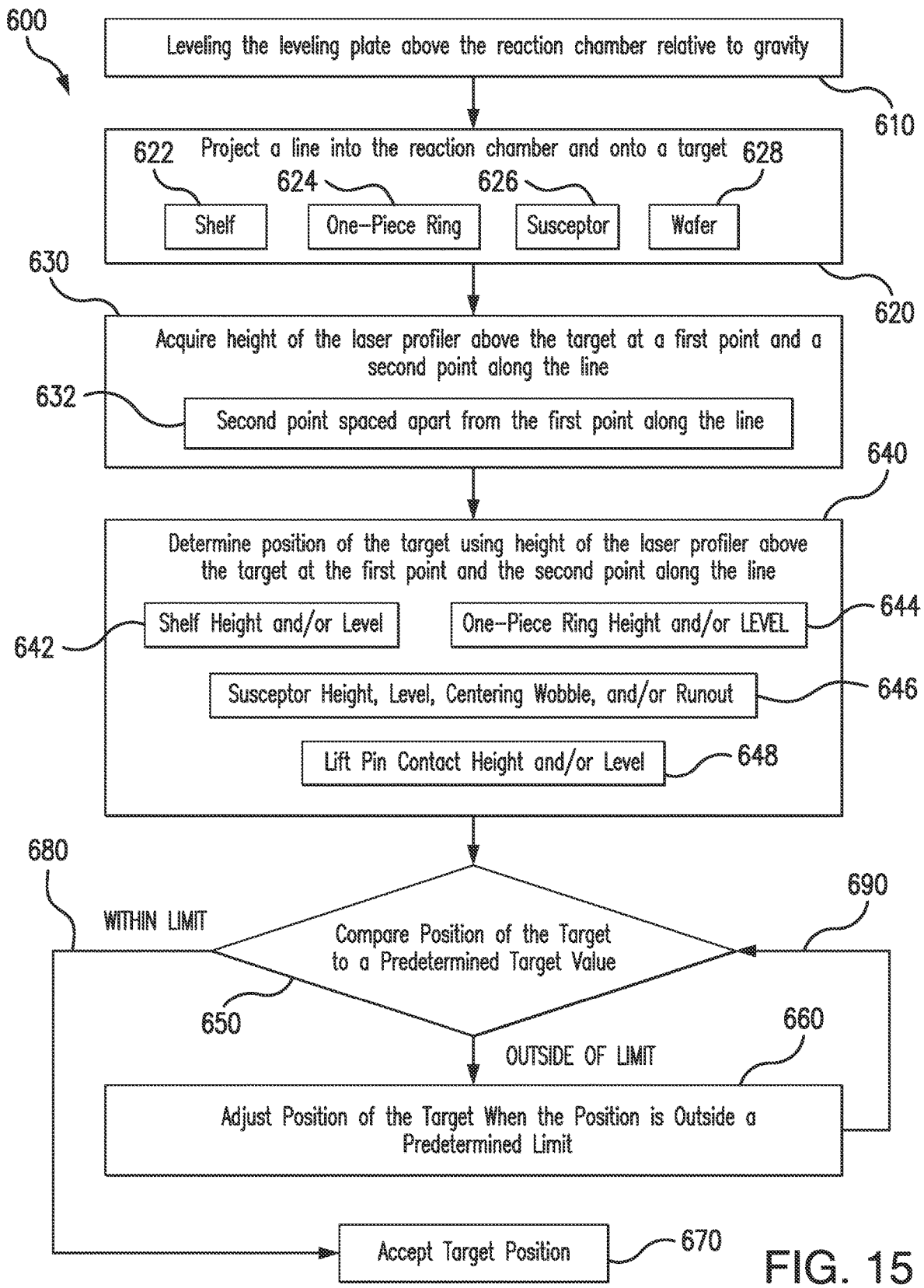

FIGS. 13 and 14 are side views of the reaction chamber and fixture according to the example of FIG. 12, showing the laser profiler acquiring height measurements of the wafer to determine to determine level of lift pins positioned within the reaction chamber; and FIG. 15 is a block diagram of a method of determining position of a target within a reaction chamber of a semiconductor processing system, showing operations of the method.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Figure 1:
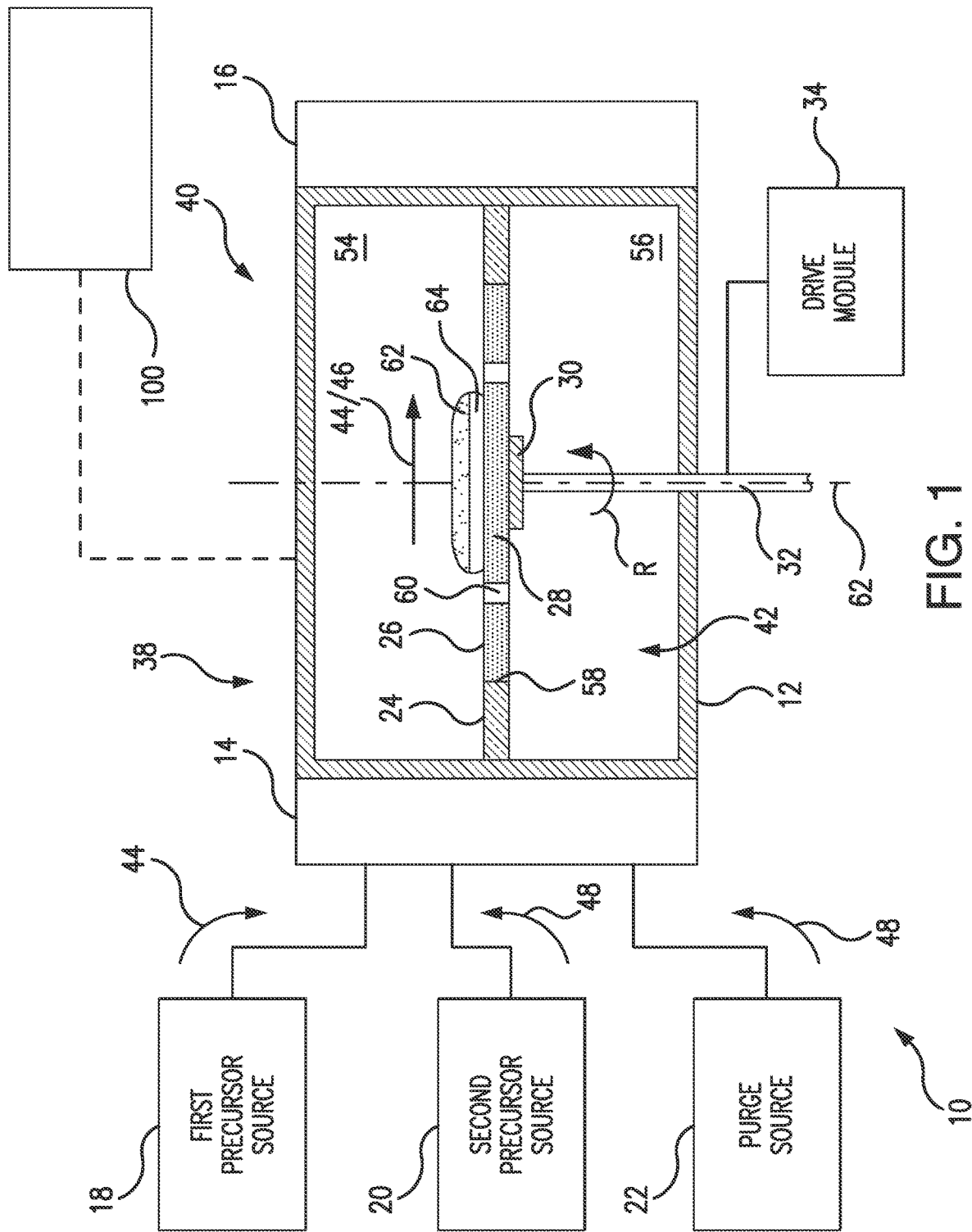
FIG. 1 is a cross-sectional side view of a semiconductor processor system with a reaction chamber and a fixture constructed in accordance with the present disclosure, schematically showing the fixture exploded away from the reaction chamber.

Reference will now be made to the drawings wherein like reference numerals identify similar structural features or aspects of the subject disclosure. For purposes of explanation and illustration, and not limitation, a partial view of an example of a fixture in accordance with the disclosure is shown in FIG. 1 and is designated generally by reference character 100. Other examples of fixtures, semiconductor processing systems, and methods of determining position of targets within reaction chambers in semiconductor processing systems in accordance with the present disclosure, or aspects thereof, are provided in FIGS. 2-15, as will be described. The fixtures, semiconductor processing systems, and methods of determining position of targets within reaction chambers in semiconductor processing systems described herein may be used to control properties of films deposited onto substrate in such systems, such as in films deposited onto wafers using epitaxial deposition techniques in atmospheric chemical vapor deposition (CVD) semiconductor processing systems, though the present disclosure is not limited to CVD semiconductor processing system or epitaxial deposition techniques in general.

Referring to FIG. 1, a semiconductor processing system 10 is shown. The semiconductor processing system includes a reaction chamber 12, an injection flange 14, an exhaust flange 16, a first precursor source 18, and a second precursor source 20. The semiconductor processing system 10 also includes a purge source 22, a shelf 24, a one-piece ring 26, and a susceptor 28. The semiconductor processing system 10 additionally includes a spider 30, a shaft 32, a drive module 34, and a plurality of lift pins 36 (shown in FIG. 3). Although a particular type of semiconductor processing system is shown in FIG. 1 and referred to throughout the present disclosure, e.g., an atmospheric CVD semiconductor processing system employed for epitaxial thin film deposition techniques, it is to be understood and appreciated that other types of semiconductor processing systems may also benefit from the present disclosure, such as atomic layer deposition systems by way of non-limiting example.

The reaction chamber 12 is configured to deposit a film 62 onto a substrate 64 and has an injection end 38, an exhaust end 40, and an interior 42. The exhaust flange 16 is connected to the exhaust end 40 of the reaction chamber 12 and fluidly couples the interior 42 of the reactor to the environment external to the reaction chamber 12. The injection flange 14 is connected to the injection end 38 of the reaction chamber 12 and is fluidly coupled to the exhaust flange 16 by the reaction chamber 12. The injection flange 14 fluidly couples the first precursor source 18, the second precursor source 20, and the purge source 22 to the reaction chamber 12. In certain examples, the reaction chamber 12 may formed from quartz. In accordance with certain examples, the reaction chamber 12 may have one or more ribs protruding from the reaction chamber 12 and extending laterally about the reaction chamber 12. The reaction chamber 12 may be as shown and described in U.S. Pat. No. 7,108,753 to Wood, issued on Sep. 19, 2006, the contents of which is incorporated herein by reference in its entirety.

The first precursor source 18 is connected to the injection flange 14 and is configured to communicate a first precursor 44 to the reaction chamber 12, e.g., a silicon-containing precursor, to the reaction chamber 12. The second precursor source 20 is connected to the injection flange 14 and is configured to communicate a second precursor 46, e.g., a dopant-containing precursor, to the reaction chamber 12. The purge source 22 is connected to the injection flange 14 and is configured to communicate a purge gas 48, e.g., hydrogen gas, to the reaction chamber 12. It is contemplated that at least one of the first precursor 44 and the second precursor 46 be selected to deposit a film 62 onto a wafer 64 supported within the interior 42 of the reaction chamber 12.

The shelf 24, the one-piece ring 26, and the susceptor 28 are arranged within the interior 42 of the reaction chamber 12. The shelf 24 and the one-piece ring 26 are arranged within the interior 42 of the reaction chamber 12 at locations longitudinally between the injection flange 14 and the exhaust flange 16. In this respect the shelf 24 is fixed within the interior 42 of the reaction chamber 12 at a location longitudinally adjacent to the injection flange 14, the one-piece ring 26 abuts the shelf 24 at a lateral joint 58 located longitudinally between the shelf 24 and the one-piece ring 26, and the shelf 24 and the one-piece ring 26 cooperatively divide the interior 42 of the reaction chamber 12 into an upper chamber 54 and a lower chamber 56. The one-piece ring 26 further defines therethrough a one-piece ring aperture 60, which fluidly couples the lower chamber 56 of the reaction chamber 12 with the upper chamber 54 of the reaction chamber 12. In certain examples the shelf 24 may be formed from a transmissive material, such as quartz by way of non-limiting material. In accordance with certain examples, the one-piece ring 26 may be formed from an opaque material, such as graphite by way of non-limiting example. It is also contemplated that the one-piece ring 26 may be coated, such as with a silicon carbide coating by way of non-limiting example.

The susceptor 28 is supported within the interior 42 of the reaction chamber 12 and is configured support thereon a substrate during deposition of a film onto the substrate, e.g., during deposition of a film 62 onto a wafer 64. In this respect it is contemplated that the susceptor 28 be supported for rotation R about a rotation axis 66 within the interior 42 of the reaction chamber 12. The rotation axis 66 extends through the one-piece ring aperture 60, the susceptor 28 is at least partially disposed within the one-piece ring aperture 60 such that the one-piece ring 26 extends about the susceptor 28, and a circumferential gap 68 extending about the susceptor 28 separates the susceptor 28 from the one-piece ring 26. In certain examples the susceptor 28 may formed from an opaque material, such as graphite by way of non-limiting example. In accordance with certain examples, the susceptor 28 may be coated, such as with a silicon carbide coating by way of the non-limiting example. It is contemplated that the susceptor 28 be configured to support the wafer 64 during deposition of the film 62 onto the wafer 64.

The spider 30 is arranged along the rotation axis 66 and is fixed in rotation relative to the susceptor 28. The shaft 32 is fixed in rotation relative to the spider 30 and is operatively associated with the drive module 34. The drive module 34 is configured to rotate the shaft 32, and therethrough the spider 30 and the susceptor 28, about the rotation axis 66 during deposition of the film 62 onto the wafer 64. The shaft 32, the spider 30, and the susceptor 28 may be as shown and described in U.S. Pat. No. 6,086,680 to Foster et al., issued on Jun. 11, 2000, the contents of which are incorporated herein by reference in its entirety.

The lift pins 36 (shown in FIG. 3) extend through the susceptor 28 and are movable between a retracted position 70 (shown in FIG. 10) and an extended position 72 (shown in FIG. 11) along the rotation axis 66. When in the retracted position 70, the lift pins 36 may be recessed within the susceptor 28 and the wafer 64 supported on the susceptor 28, e.g., for deposition of the film 62 onto the wafer 64. When in the extended position 72, the lift pins 36 may protrude from the susceptor 28 such that the lift pins 36 support the wafer 64 above the susceptor 28, e.g., for loading of the wafer 64 onto the susceptor 28 and/or for unloading of the wafer 64 from the susceptor 28, e.g., subsequent to deposition of the film 62 onto the wafer 64. The lift pins 36 may be as shown and described in U.S. Patent Application Publication No. 2019/0051555 A1 to Hill et al., filed on Aug. 8, 2017, the contents of which are incorporated herein by reference in its entirety.

As has been explained above, positioning of components within the reaction chamber 12 may influence properties of the film 62 deposited onto the wafer 64, e.g., by altering gas flow and/or thermal conditions within the reaction chamber 12 during deposition of the film 62 onto the wafer 64. For example, position of the one-piece ring 26 relative the shelf 24 may influence gas flow and/or thermal conditions within the reaction chamber 12. Positioning of the susceptor 28 relative to the one-piece ring 26, both statically and during rotation R, may also influence gas flow and/or thermal conditions within the reactor. And positioning of the plurality of lift pins 36 relative to the susceptor 28 may further influence gas flow and/or thermal conditions within the reaction chamber 12. To limit variation within the film 62 due positioning of these components, as well as others, the fixture 100 is provided.

Figure 2:
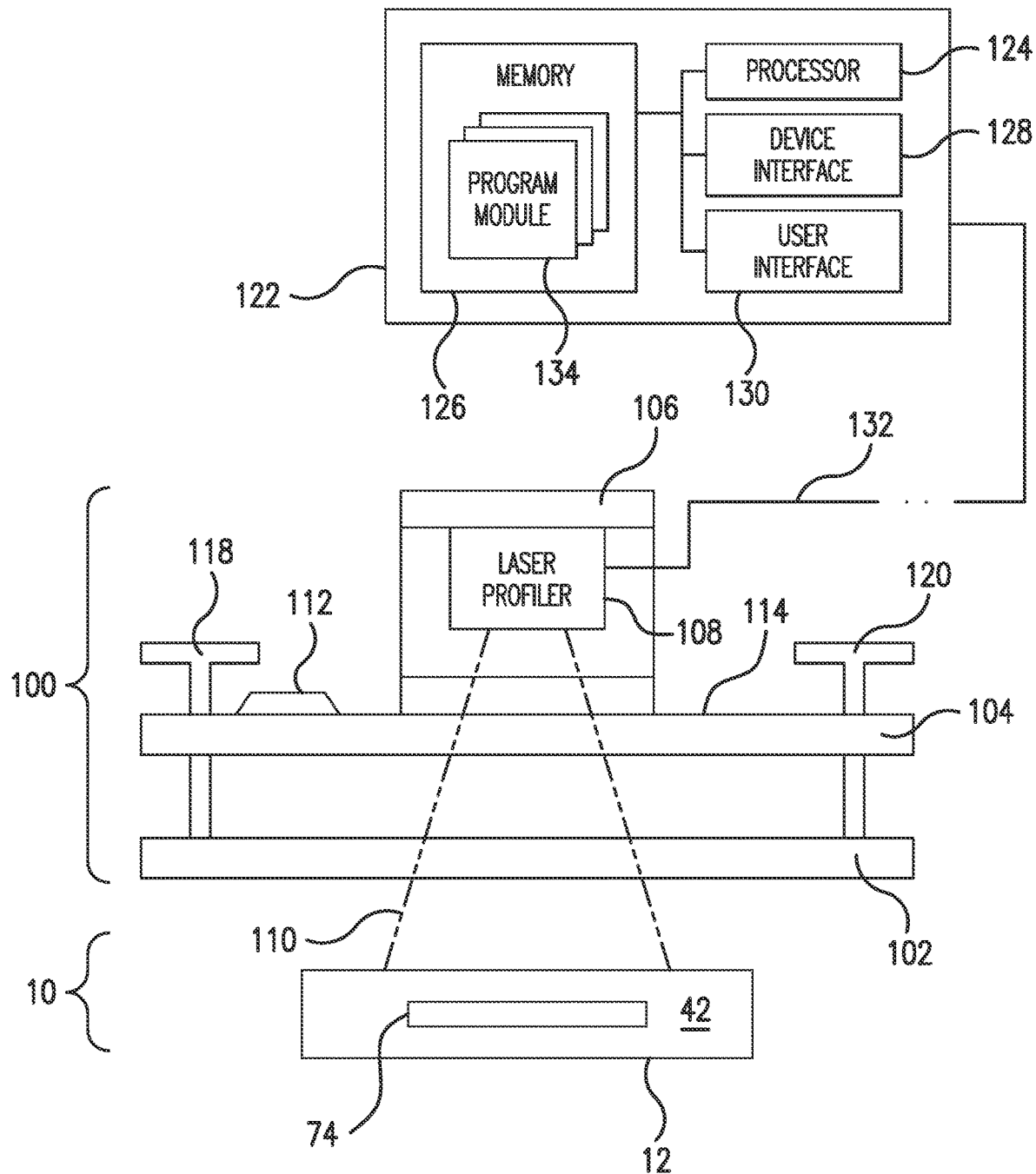
FIG. 2 is a cross-sectional end view of the fixture and the reaction chamber of FIG. 1, schematically showing a laser profiler suspended from a bracket and supported on a leveling plate and a frame such that a target within the reaction chamber is in a field of view of the laser profiler.

With reference to FIG. 2, the fixture 100 is shown. The fixture 100 is configured for determining position of a target 74 within the reaction chamber 12 of the semiconductor processing system 10 and includes a frame 102, a leveling plate 104, a bracket 106, and a laser profiler 108. The frame 102 is configured for fixation relative to the reaction chamber 12. The leveling plate 104 is supported on the frame 102. The bracket 106 is supported on the leveling plate 104 and overlays the frame 102. The laser profiler 108 is suspended from the bracket 106, overlays the leveling plate 104, and has a field of view 110. The field of view 110 extends through the leveling plate 104 and the frame 102 to determine position of the target 74, which is in the field of view 110 of the laser profiler 108.

In certain examples, the fixture may include a level 112. In such examples the level may be configured to indicate level of a mounting surface 114 relative to gravity. In accordance with certain examples, the level 112 may be a first level 112 and the fixture 100 may include a second level 116 (shown in FIG. 6). In such examples the first level 112 may extend longitudinally along the leveling plate 104 and be configured to indicate longitudinal level of the mounting surface 114, and the second level 116 may extend laterally across the leveling plate 104 and be configured to indicate lateral level of the mounting surface 114. The second level 116 may be orthogonal relative to the first level 112. Either (or both) the first level 112 and the second level 116 may be fixed relative to the mounting surface 114, e.g., permanently affixed to the leveling plate 104. Either (or both) the first level 112 and the second level 116 may be removably fixed to the mounting surface 114. As will be appreciated by those of skill in the art in view of the present disclosure, fixation may simplify the setup of the fixture 100. As will also be appreciated by those of skill in the art in view of the present disclosure, removable fixation may simplify calibration of either (or both) the first level 112 and the second level 116.

In accordance with certain examples, the fixture 100 may include a leveling screw 118. In such examples the leveling screw 118 spaces the leveling plate 104 from the frame 102 and is configured to control level of the leveling plate 104 relative to frame 102, e.g., longitudinal level and/or lateral level of the leveling plate 104 relative to the frame 102. Level control may be provided, for example, by threaded engagement of a shank of the leveling screw 118 within the leveling plate 104 and abutment of a tip of the leveling screw 118 against the frame 102. However, as will be appreciated by those of skill in the art in view of the present disclosure, other arrangements of the leveling screw 118 are possible within the scope of the present disclosure.

It is contemplated that the leveling screw 118 may be a first leveling screw 118 and that the fixture 100 may include a second leveling screw 120. In such examples the second leveling screw 120 may be similar to the first leveling screw 118 and additionally be lateral and/or longitudinally offset from the first leveling screw 118 on the leveling plate 104. In such examples the second leveling screw 120 may cooperate with the first leveling screw 118 to provide control of longitudinal level in isolation of lateral level or lateral level in isolation of longitudinal level during leveling of the leveling plate 104. Although two (2) leveling screws are shown in FIG. 2 it is to be understood and appreciated that the fixture 100 may include more than two (2) leveling screws, e.g., three (3) or more leveling screws, and remain within the scope of the present disclosure.

In certain examples, the target 74 may include the shelf 24 (shown in FIG. 1). In such examples the laser profiler 108 may be supported above the shelf 24 to acquire height(s) of the laser profiler 108 relative to the shelf 24. In accordance with certain examples, the target 74 may include the one-piece ring 26 (shown in FIG. 1). In such examples the laser profiler 108 may be supported above the one-piece ring 26 to acquire height(s) of the laser profiler 108 relative to the one-piece ring 26. In further examples, the target may include the susceptor 28. In such examples the laser profiler 108 may be supported above the susceptor 28 such that the laser profiler 108 may acquire height(s) of the laser profiler 108 relative to the susceptor 28 and/or the one-piece ring 26 at location(s) adjacent to the susceptor 28. It is also contemplated that the laser profiler 108 may be supported above a wafer, e.g., the wafer 64, positioned between the susceptor 28 and the leveling plate 104 to acquire height(s) of the laser profiler 108 relative to the wafer 64. In this respect it is contemplated that the laser profiler 108 may be supported at a location overlaying the rotation axis 66 and/or a location radially offset from the rotation axis 66.

In certain examples, the fixture 100 may include a controller 122. The controller 122 may be disposed in communication with the laser profiler 108, such as by a wired link 132. As shown in FIG. 2, the controller 122 includes a processor 124, a memory 126, a device interface 128, and a user interface 130. The device interface 128 connects the device interface 128 with the controller 122, e.g., via the wired link 132. The processor 124 is operatively connected to the user interface 130 and disposed in communication with the memory 126. The memory 126 includes a non-transitory machine-readable medium having a plurality of program modules 134 recorded thereon that, when read by the processor 124, cause the processor 124 to execute certain operations. Among those operations are operations of a method 600 (shown in FIG. 15) of determining position of a target, e.g., the target 74, a reaction chamber, e.g. the reaction chamber 12, using height(s) of the laser profiler 108 relative to the target.

It is contemplated that, in certain examples, the controller 122 be configured to determine height and/or level of the shelf 24 (shown in FIG. 1) within the reaction chamber 12 using height(s) of the laser profiler 108 relative to the shelf 24 acquired by the laser profiler 108. The controller 122 may be configured to determine height and/or level of the one-piece ring 26 (shown in FIG. 1) relative to the shelf 24 using heights of the laser profiler 108 relative to the one-piece ring 26 and/or the shelf 24 acquired by the laser profiler 108. Alternatively (or additionally), the controller 122 may be configured to determine height, level, centering, wobble, and/or runout of the susceptor 28 (shown in FIG. 1) using height(s) of the laser profiler 108 relative to the susceptor 28 and/or the one-piece ring 26 using the laser profiler 108. It is also contemplated that the controller 122 may be configured to determined contact height and/or level of the plurality of lift pins 36 (shown in FIG. 3) using height(s) of the laser profiler 108 relative to a wafer, e.g., the wafer 64 (shown in FIG. 1), supported by the plurality of lift pins 36 acquired by the laser profiler 108. In this respect speed during movement of the plurality of lift pins 36 relative to the susceptor 28 may be tuned based on the determined contact height, e.g., by established a height at which the plurality of lift pins 36 decelerate prior to contacting a wafer supported on the susceptor 28.

Figure 3:
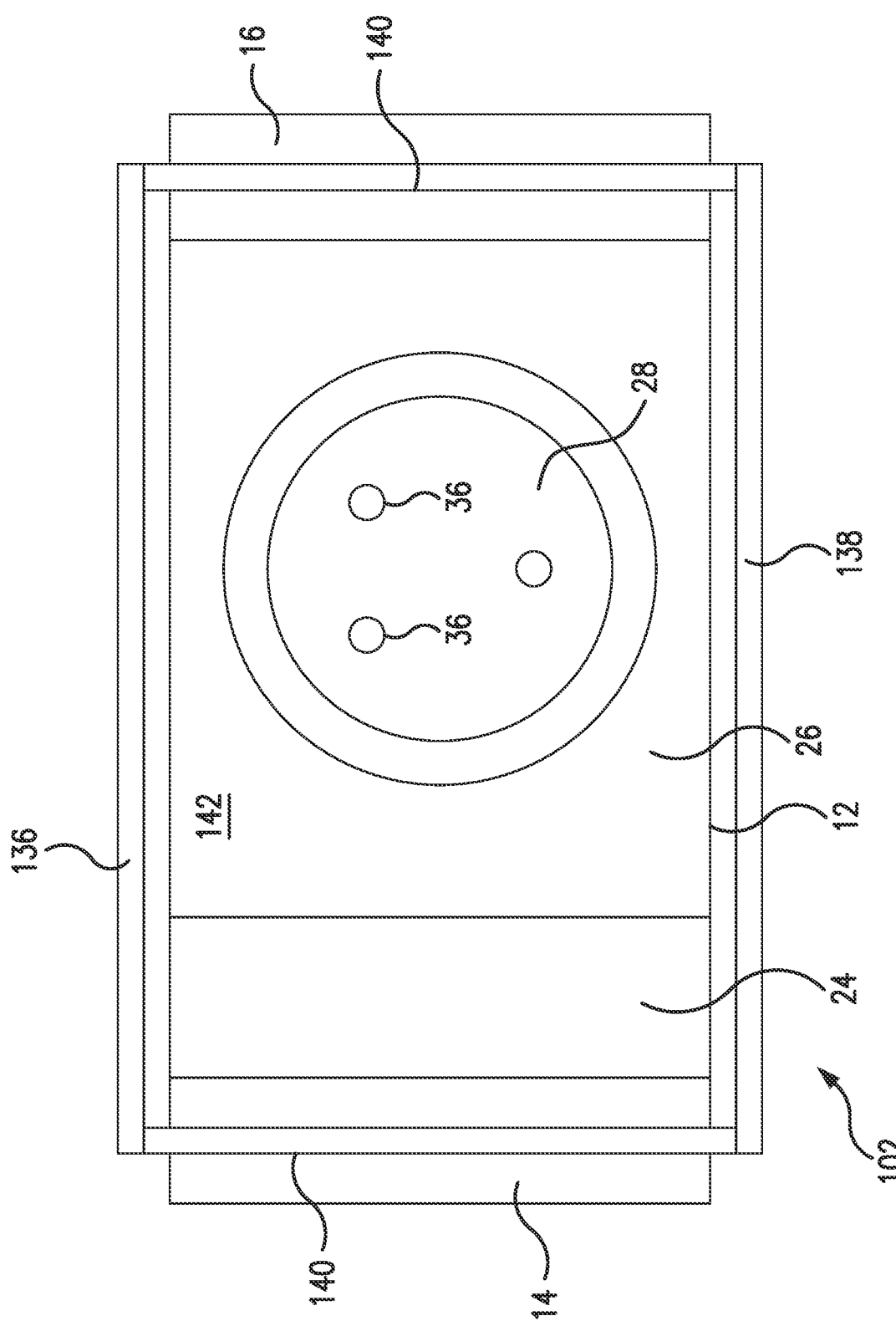
FIG. 3 is a plan view of the reaction chamber and a portion of the fixture of FIG. 1, schematically showing the frame spanning the reaction chamber and supported at longitudinally opposite ends on an injection flange and an exhaust flange of the reaction chamber.

With reference to FIG. 3, the frame 102 is shown. The frame 102 is configured to support the laser profiler 108 at a location above the target 74 (shown in FIG. 2), e.g., the shelf 24, the one-piece ring 26, the susceptor 28, and/or the lift pins 36, and in this respect includes a first stringer 136, a second stringer 138, and a plurality of joists 140. The first stringer 136 longitudinally spans the reaction chamber 12 and is supported at longitudinally opposite ends by the injection flange 14 and the exhaust flange 16. The second stringer 138 extends in parallel with the first stringer 136, also spans the reaction chamber 12, and is further supported at longitudinally opposite ends by the injection flange 14 and the exhaust flange 16. The plurality of joists 140 laterally span the reaction chamber 12 and connect the first stringer 136 to the second stringer 138. It is contemplated that the plurality of joists 140 and at least portions of the first stringer 136 and the second stringer 138 and bound a frame aperture 142. It is contemplated that the frame aperture 142 overlay the target 74 such that the field of view 110 of the laser profiler 108 passes through the frame aperture 142.

Figure 4:
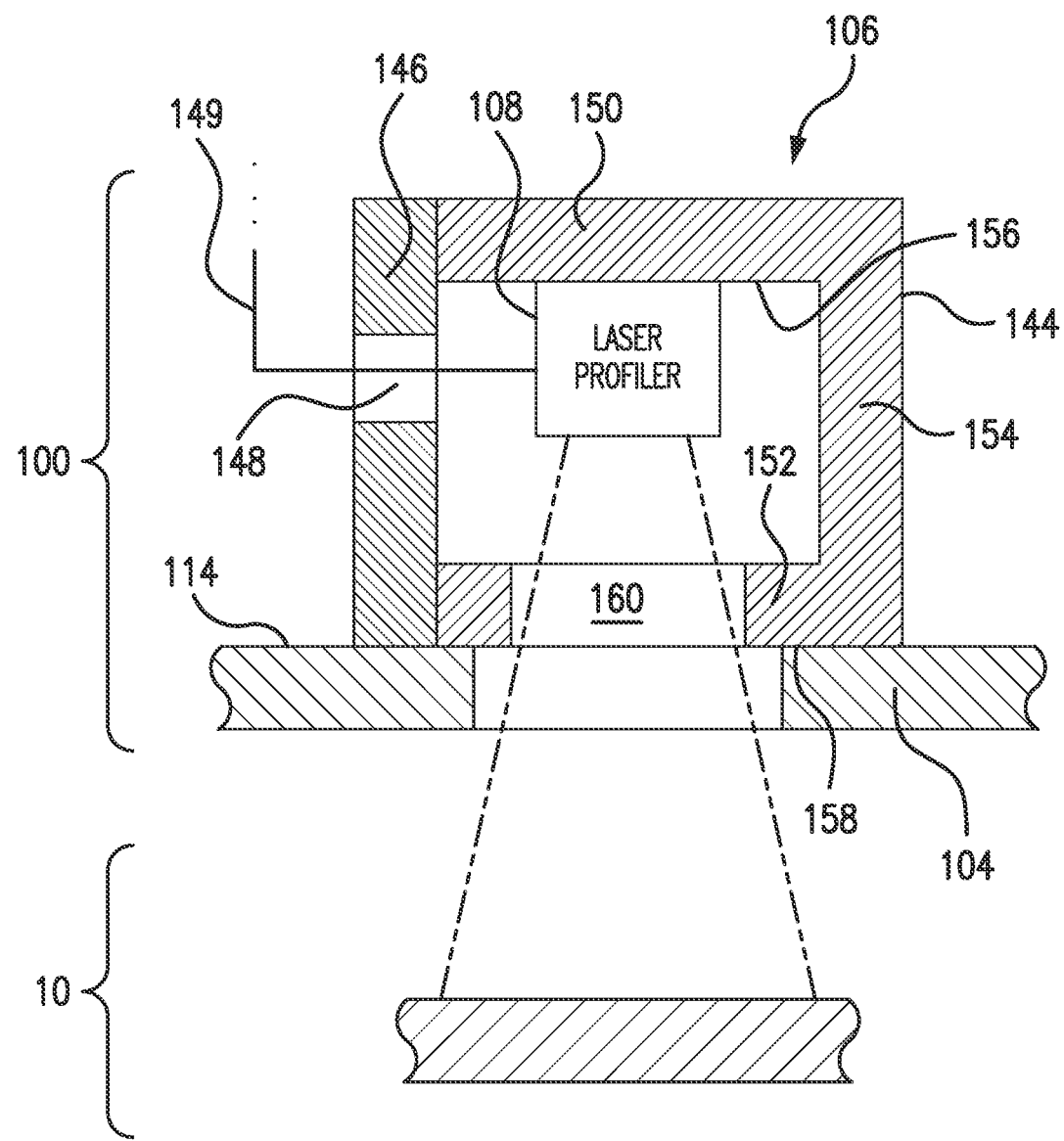
FIG. 4 is a cross-sectional side view of a portion of the fixture of FIG. 1 including the bracket, showing a U-shaped body and an end cap of the bracket.

With reference to FIG. 4, the bracket 106 is shown. The bracket 106 is configured to suspend the laser profiler 108 above the leveling plate 104 while the bracket 106 is supported by the leveling plate 104. In this this respect the bracket 106 includes a U-shaped body 144 and an end cap 146 with a cable passthrough 148. The U-shaped body 144 has an upper tine 150, a lower tine 152, and a web 154. The web 154 extends between the upper tine 150 and the lower tine 152, and connects the upper tine 150 to the lower tine 152. The end cap 146 is seated to ends of the lower tine 152 and the upper tine 150 located on side of the lower tine 152 and the upper tine 150 opposite the web 154. It is contemplated that the end cap 146 be spaced apart from the web 154 by the lower tine 152 and the upper tine 150.

The upper tine 150 of the U-shaped body 144 has a profiler seat 156 and is spaced apart from the lower tine 152 by the end cap 146 and the web 154. The profiler seat 156 opposes the lower tine 152, is substantially planar, and seats thereon the laser profiler 108. More specifically, the laser profiler 108 is suspended from the bracket 106 at the profiler seat 156 of the upper tine 150, the field of view 110 of the laser profiler 108 thereby extending toward the lower tine 152 from the profiler seat 156 of the upper tine 150 and passing through the lower tine 152. In certain examples the laser profiler 108 may be fixed to the profiler seat 156 by one or more fasteners. In certain examples the one or more fastener may be received in the upper tine 150 and threadedly seated in the laser profiler 108.

The lower tine 152 has a bracket seat 158 and a bracket aperture 160. The bracket aperture 160 extends through the lower tine 152 at a location between the web 154 and the end cap 146 and is in registration with the laser profiler 108 such that the field of view 110 of the laser profiler 108 extends through the bracket aperture 160. The bracket seat 158 is defined on a side of the lower tine 152 opposite the upper tine 150 and is substantially parallel to the profiler seat 156. It is contemplated that the profiler seat 156 be conformal with one or mount, e.g., a shelf mount 162 (shown in FIG. 6) defined on the mounting surface 114 of the leveling plate 104, level of the mounting surface 114 thereby transferring the profiler seat 156. As will be appreciated by those of skill in the art in view of the present disclosure, transferring level of the mounting surface 114 to the profiler seat 156 via the bracket seat 158 may simplify setup of the fixture 100 (shown in FIG. 1) on the reaction chamber 12 (shown in FIG. 1).

A cable 149 extends through the cable passthrough 148 to communicatively couple the laser profiler 108 to controller 122 (shown in FIG. 2), e.g., via the wired or wireless link 132. In this respect the cable passthrough 148 extends through the end cap 146 and is routed therethrough to the laser profiler 108. In certain examples, the cable 149 may provide electrical power to the laser profiler 108. In accordance with certain examples, the cable 149 may provide data communication to the laser profiler 108. It is further contemplated that the cable passthrough 148 may extend through the U-shaped body 144 and remain within the scope of the present disclosure. Although shown and described herein as employed the cable 149 for power and/or data communication, it is also contemplated that the laser profiler 108 may be wirelessly connected to the controller 122 and/or employ batteries for power and remain within the scope of the present disclosure.

Figure 5:
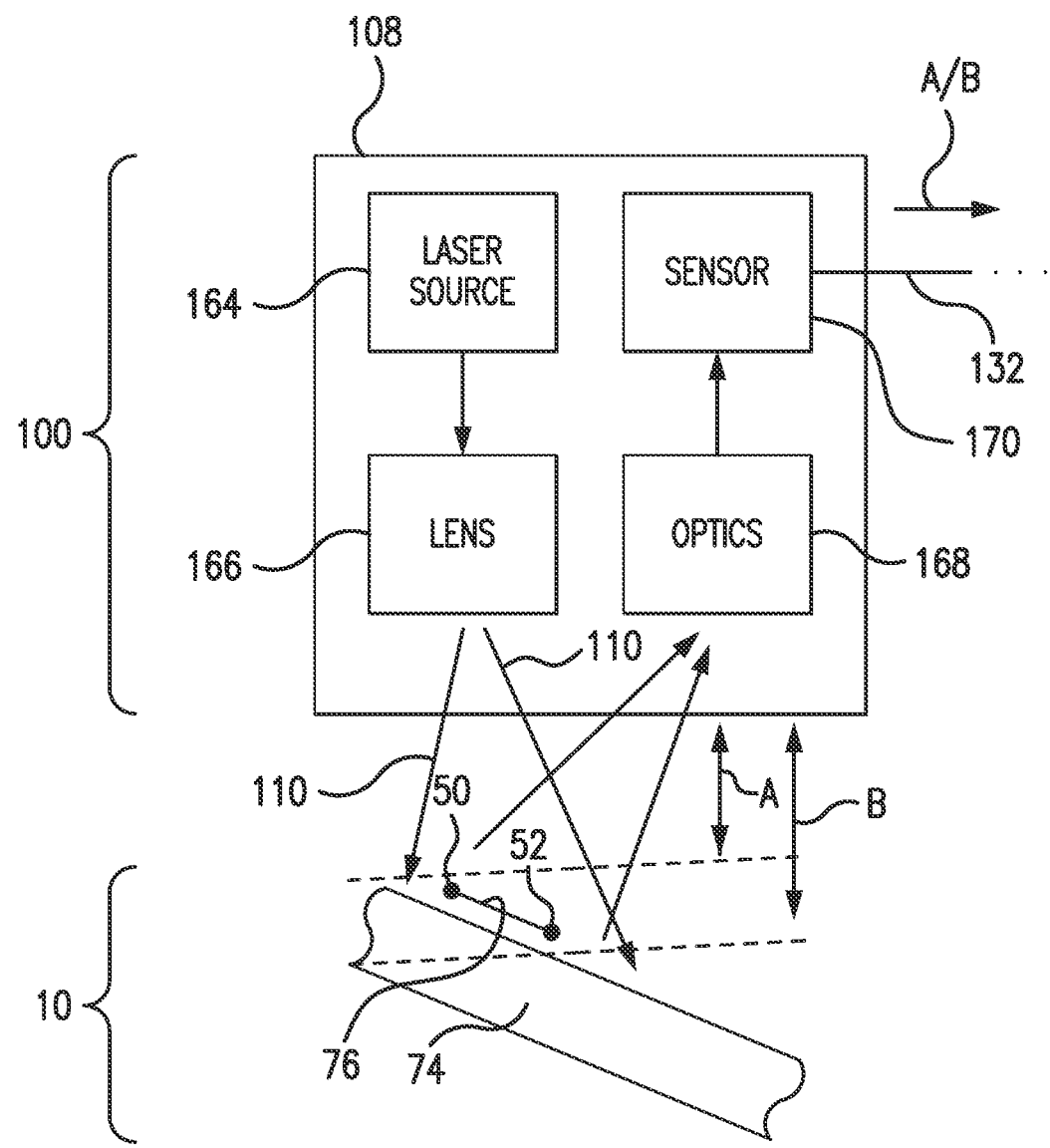
FIG. 5 is a schematic view of the laser profiler of FIG. 1, showing the laser profiler projecting a line into the reaction chamber to determine position of the target.

With reference to FIG. 5, the laser profiler 108 is shown. The laser profiler 108 is configured to acquire height of the laser profiler 108 relative to the target 74 located within the reaction chamber 12 (shown in FIG. 1) and in this respect includes a laser source 164, an expansion lens 166, collection optics 168, and a sensor 170. The laser source 164 is configured to illuminate the expansion lens 166 with a beam. In certain examples the laser source 164 may include a visible wavelength laser source. In accordance with certain examples, the laser source 164 may include a blue wavelength laser source. It is also contemplated that, in accordance with certain examples, that the laser source 164 may include a 405-nanometer laser source. As will be appreciated by those of skill in the art, employment of such laser sources may be relatively accurate when acquiring height using illumination projected through transparent structures having complex geometries, such as reaction chambers having external ribs.

The expansion lens 166 is configured to expand and project the beam received from the laser source 164 and incident upon the expansion lens 166. More specifically, the expansion lens 166 is configured widen the beam along a singular diameter of the beam to define the line 76 using the beam incident upon the expansion lens 166. It is contemplated that the laser profiler 108 project the line 76 onto the target 74 according to the location of the mount supporting the bracket 106, e.g., the shelf mount 162, the target in turn at least partially reflecting the line 76 and thereby coupling the expansion lens 166 to the collection optics 168.

The collection optics 168 are configured to collect illumination reflected from the target 74 and communicate the collected illumination to the sensor 170. The sensor 170 is configured to convert illumination received from the collection optics 168 into height(s) of the laser profiler 108 relative to the line 76. In certain examples, the sensor is configured to convert the illumination received from the collection optics 168 into a first height A of the laser profiler 108 above a first point 50 along the line 76 on the target 74 and a second height B of the laser profiler 108 above a second point 52 along the line 76 on the target 74, the second height B being spaced apart from the first height A along the line 76. In such examples, the sensor 170 may further communicate the first height A and the second height B to the controller 122, e.g., for determining position of the target 74 within the reaction chamber 12 (shown in FIG. 1) and/or to display the heights on user interface 130.

Figure 6:
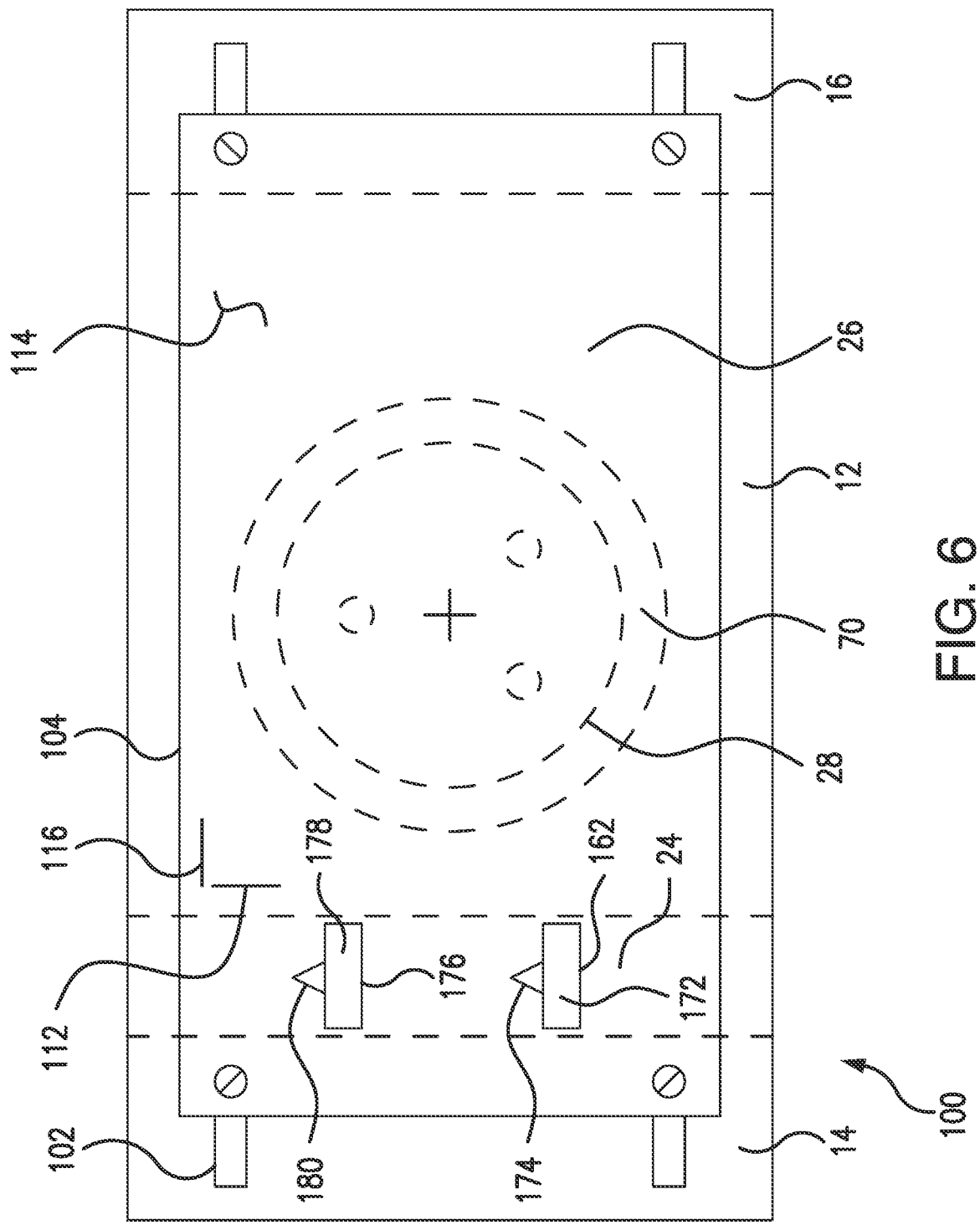
FIG. 6 is a plan view of the reaction chamber and a portion of the fixture of FIG. 1 including the leveling plate, schematically showing a shelf mount located on the leveling plate and overlaying a shelf positioned within the reaction chamber according to an example.

With reference to FIG. 6, the leveling plate 104 is shown. In the illustrated example the leveling plate 104 includes the shelf mount 162. The shelf mount 162 is located on the mounting surface 114 of the leveling plate 104 and includes a shelf mount aperture 172 and a shelf mount registration feature 174. The shelf mount aperture 172 extends through the leveling plate 104 at a location that, when the leveling plate 104 is supported on the frame 102 and the frame 102 supported on the injection flange 14 and the exhaust flange 16, overlays the shelf 24. The shelf mount registration feature 174 is located on the mounting surface 114 at a location adjacent to the shelf mount aperture 172 and is configured to fix the bracket 106 on the mounting surface 114 such that at least a portion of the shelf 24 is in the field of view 110 (shown in FIG. 4) of the laser profiler 108.

It is contemplated that the laser profiler 108 (shown in FIG. 2) be seated on the shelf mount 162 and project the line 76 (shown in FIG. 5) onto the shelf 24 through the leveling plate 104 and the frame 102 at the shelf mount 162. It is further contemplated that the laser profiler 108 acquire height of the laser profiler 108 relative to the shelf 24 at the shelf mount 162 along the line 76. The acquired height may be communicated to the controller 122 (shown in FIG. 2), and the controller 122 may determine position of the shelf 24 using the height received from the laser profiler 108. In certain examples, determining position of the shelf 24 may include determining height and/or longitudinal level of the shelf 24 relative to the mounting surface 114 of the leveling plate 104.

In certain examples, the shelf mount 162 may be a first shelf mount 162 and the leveling plate 104 may include a second shelf mount 176. In such examples, the second shelf mount 176 may be located on the mounting surface 114 at a location laterally offset from the first shelf mount 162. In such examples, the second shelf mount 176 may include a second shelf mount aperture 178 and a second shelf mount registration feature 180. The second shelf mount aperture 178 may extend through the leveling plate 104 at a location overlaying the shelf 24 laterally offset from the first shelf mount 162. The second shelf mount registration feature 180 may be located on the mounting surface 114 at a location adjacent to the second shelf mount aperture 178. The second shelf mount registration feature 180 may further be configured to fix the bracket 106 on the mounting surface 114 such that a second portion of the shelf 24 is in the field of view 110 of the laser profiler 108.

In accordance with certain examples, the bracket 106 (shown in FIG. 2) and the laser profiler 108 (shown in FIG. 2) may be removed from the first shelf mount 162 and seated on the second shelf mount 176 once position of the shelf 24 has been determined by the controller 122 (shown in FIG. 2). Once seated on the second shelf mount 176, the laser profiler 108 may project the line 76 onto a second portion of the shelf 24 and acquire height of the laser profiler 108 relative to the second portion of the shelf 24 along the line 76. The acquired height may be communicated to the controller 122, and the controller 122 may determine additional positional information of the shelf 24. In certain examples, the additional positional information may include lateral level of the shelf 24 relative to the mounting surface 114 of the leveling plate 104.

Figure 7:
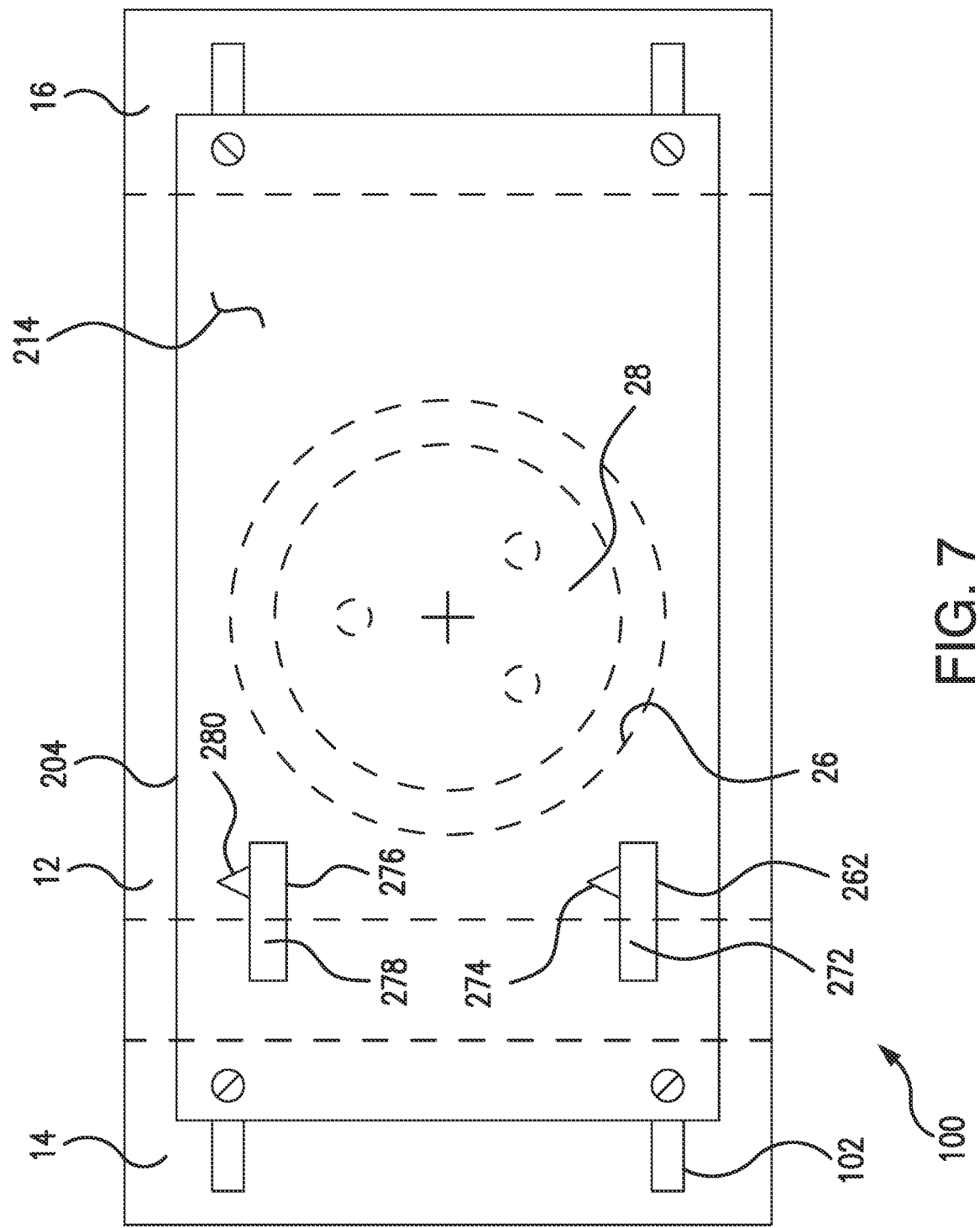
FIG. 7 is a plan view of the reaction chamber and a portion of the fixture of FIG. 1 including the leveling plate, schematically showing a one-piece ring mount located on the leveling plate and overlaying a one-piece ring positioned within the reaction chamber.

With reference to FIG. 7, the fixture 100 is shown according to an example including a leveling plate 204. The leveling plate 204 has a mounting surface 214, is similar to the leveling plate 104 (shown in FIG. 2), and additionally includes a one-piece ring mount 262. The one-piece ring mount 262 is located on the mounting surface 214 and includes a one-piece ring mount aperture 272 and a one-piece ring mount registration feature 274. The one-piece ring mount aperture 272 extends through the leveling plate 204 at a location that, when the leveling plate 104 is supported on the frame 102, and the frame 102 supported on the injection flange 14 and the exhaust flange 16, the one-piece ring mount aperture 272 overlays the one-piece ring 26. The one-piece ring mount registration feature 274 is located on the mounting surface 214 at a location adjacent to the one-piece ring mount aperture 272 and is configured to fix the bracket 106 (shown in FIG. 2) on the mounting surface 214 such that a portion of the one-piece ring 26 is in the field of view 110 (shown in FIG. 2) of the laser profiler 108

(shown in FIG. 2). In certain examples, the one-piece ring mount 262 may be longitudinally and/or laterally offset from the shelf mount 162 (shown in FIG. 6).

It is contemplated that the laser profiler 108 (shown in FIG. 2) be seated on the one-piece ring mount 262 and project the line 76 (shown in FIG. 5) onto the one-piece ring 26 through the leveling plate 204 and the frame 102 at the one-piece ring mount 262. It is further contemplated that the laser profiler 108 acquire height of the laser profiler 108 relative to the one-piece ring 26 at the one-piece ring mount 262. The acquired height may be communicated to the controller 122 (shown in FIG. 2), and the controller 122 may determine position of the one-piece ring 26 using the height received from the laser profiler 108. In certain examples, determining position of the one-piece ring 26 may include determining height and/or longitudinal level of the one-piece ring 26 relative to the mounting surface 214.

In certain examples, the one-piece ring mount 262 may be a first one-piece ring mount 262 and the leveling plate 204 may include a second one-piece ring mount 276. In such examples, the second one-piece ring mount 276 may be located on the mounting surface 214 at a location laterally offset from the first one-piece ring mount 262. In such examples, the second one-piece ring mount 276 may include both a second one-piece ring mount aperture 278 and a second one-piece ring mount registration feature 280. The second one-piece ring mount aperture 278 may extend through the leveling plate 104 at a location overlaying the one-piece ring 26 and laterally offset from the first one-piece ring mount 262. The second one-piece ring mount registration feature 280 may be located on the mounting surface 214 at a location adjacent to the second one-piece ring mount aperture 278, and may further be configured to fix the bracket 106 on the mounting surface 214 of the leveling plate 204 such that a second portion of the one-piece ring 26 is in the field of view 110 (shown in FIG. 2) of the laser profiler 108 (shown in FIG. 2).

In accordance with certain examples, the bracket 106 (shown in FIG. 2) and the laser profiler 108 (shown in FIG. 2) may be removed from the first one-piece ring mount 262 once the heights are acquired at the first susceptor mount 362, and thereafter be seated on the second one-piece ring mount 276. Once seated on the second one-piece ring mount 276, the laser profiler 108 may project the line 76 (shown in FIG. 5) onto a second portion of the one-piece ring 26 and acquire height of the laser profiler 108 relative to the second portion of the one-piece ring 26 along the line 76. The acquired height may be communicated to the controller 122 (shown in FIG. 2), and the controller 122 may determine additional position information of the one-piece ring 26 using the heights acquired from the second one-piece ring mount 276. In certain examples, the additional position information may include lateral level of the one-piece ring 26 relative to the mounting surface 214 of the leveling plate 204.

Figure 8:
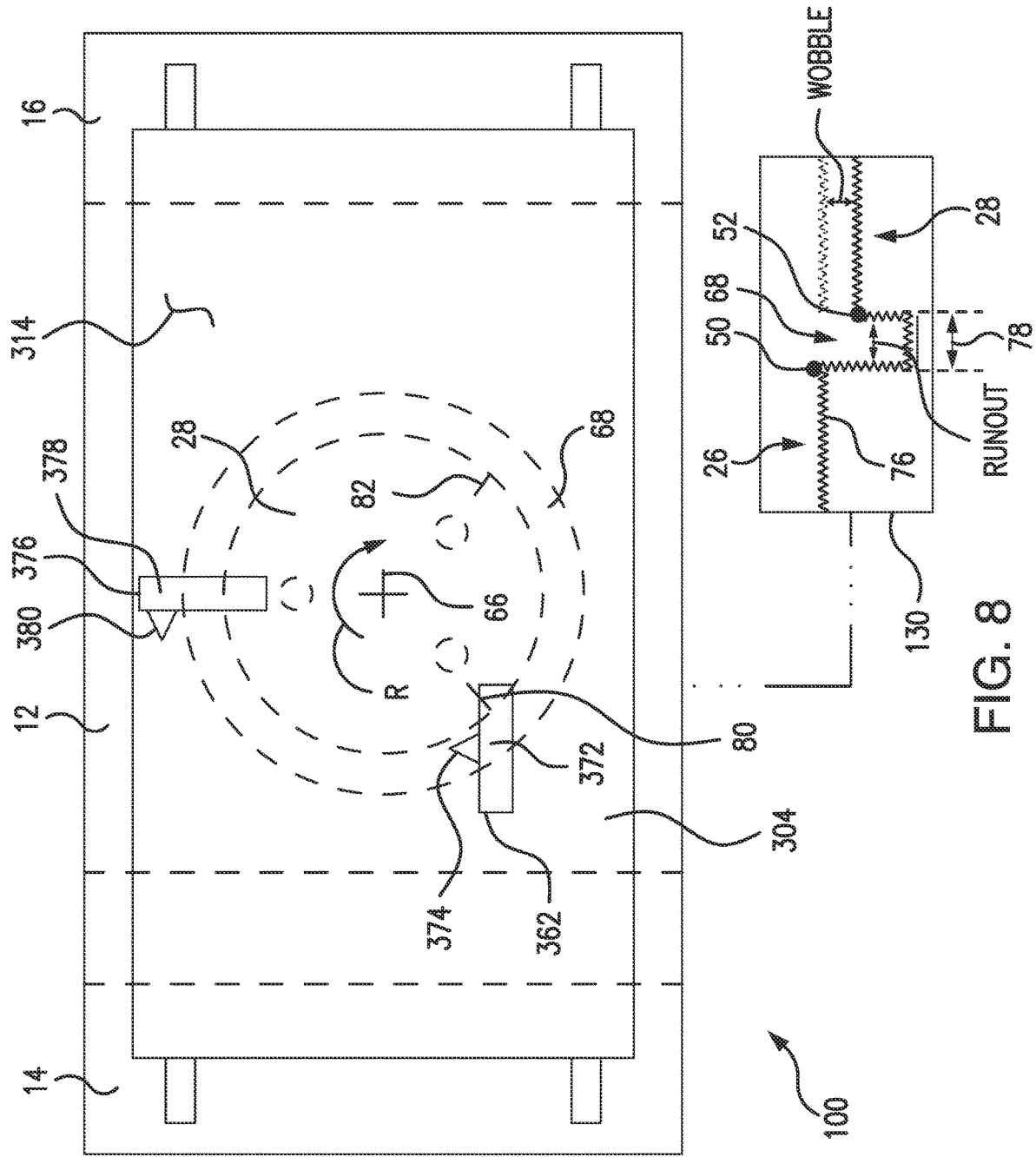
FIG. 8 is a plan view of the reaction chamber and a portion of the fixture of FIG. 1 including the leveling plate, schematically showing a susceptor located on the leveling plate and overlaying a susceptor positioned within the reaction chamber.

With reference to FIG. 8, the fixture 100 is shown according to an example including a leveling plate 304. The leveling plate 304 has a mounting surface 314, is similar to the leveling plate 104 (shown in FIG. 2), and additionally includes a susceptor mount 362. The susceptor mount 362 is located on the mounting surface 314 and includes a susceptor mount aperture 372 and a susceptor mount registration feature 374. The susceptor mount aperture 372 extends through the leveling plate 304 at a location that, when the leveling plate 304 is supported on the frame 102, and the frame 102 supported on the injection flange 14 and the exhaust flange 16, the susceptor mount aperture 372 overlays the susceptor 28. The susceptor mount registration feature 374 is located on the mounting surface 314 at a location adjacent to the susceptor mount aperture 372 and is configured to fix the bracket 106 (shown in FIG. 2) on the mounting surface 314 such that a portion of the susceptor 28 is in the field of view 110 (shown in FIG. 2) of the laser profiler 108 (shown in FIG. 2). In certain examples, the susceptor mount 362 may be longitudinally and/or laterally offset from the one-piece ring mount 262 (shown in FIG. 7).

It is contemplated that the laser profiler 108 (shown in FIG. 2) be seated on the susceptor mount 362 and project the line 76 (shown in FIG. 5) onto the susceptor 28 through the leveling plate 304 and the frame 102 from the susceptor mount 362. It is further contemplated that the laser profiler 108 acquire height of the laser profiler 108 relative to the susceptor 28 at the susceptor mount 362. The acquired height may be communicated to the controller 122 (shown in FIG. 2), and the controller 122 may determine position of the susceptor 28 using the height received from the laser profiler 108. In certain examples, determining position of the susceptor 28 may include determining height and/or longitudinal level of the susceptor 28 relative to the mounting surface 314 of the leveling plate 304.

It is contemplated that the line 76 (shown in FIG. 5) may be projected through the susceptor mount aperture 372 onto a portion of the susceptor 28 bounding the circumferential gap 68, a portion of the one-piece ring 26 bounding the circumferential gap 68, and into the circumferential gap 68. In such examples the first point 50 and the second point 52 may be located at edges of the susceptor 28 and the one-piece ring 26 bounding the circumferential gap 68, and width 78 acquired by determining width of the circumferential gap 68 between the first point 50 and the second point 52. As will be appreciated by those of skill in the art in view of the present disclosure, the width 78 may be determined without imaging the circumferential gap, limiting error associated with imaging the circumferential gap 68 and portions of the susceptor 28 and the one-piece ring 26 bounding the circumferential gap 68. In certain examples, height measurements acquired by the laser profiler 108 (shown in FIG. 2) may be displayed on the user interface 130, simplifying analysis of the width 78 by a user.

In certain examples, the susceptor mount 362 may be a first susceptor mount 362 and the leveling plate 304 may include a second susceptor mount 376. In such examples the second susceptor mount 376 may be located on the mounting surface 314 at a location laterally offset from the first susceptor mount 362 and may include both a second susceptor mount aperture 378 and a second susceptor mount registration feature 380. The second susceptor mount aperture 378 may extend through the leveling plate 304 at a location overlaying the susceptor 28 and laterally offset from the first susceptor mount 362. The second susceptor mount registration feature 380 may be located on the mounting surface 314 at a location adjacent to the second susceptor mount aperture 378. The second susceptor mount registration feature 380 may further be configured to fix the bracket 106 (shown in FIG. 2) on the mounting surface 314 such that a second portion of the susceptor 28 is in the field of view 110 (shown in FIG. 2) of the laser profiler 108

Once height of the laser profiler 108 relative to the susceptor 28 is acquired from the first susceptor mount 362, the bracket 106 and the laser profiler 108 may be removed from the first susceptor mount 362 the bracket 106 and the laser profiler 108 seated at the second susceptor mount 376. Once seated on the second susceptor mount 376, the laser profiler 108 may project the line 76 (shown in FIG. 5) onto a second portion of the susceptor 28 and acquire height of the laser profiler 108 relative to the second portion of the susceptor 28 along the line 76. The acquired height may be communicated to the controller 122 (shown in FIG. 2), and the controller 122 may determine additional position information of the susceptor 28 using the heights acquired from the second susceptor mount 376. In certain examples, the additional position information may include lateral level of the susceptor 28 relative to the mounting surface 314 of the leveling plate 304.

In accordance with certain examples, determining position of the susceptor 28 may include determining wobble of the susceptor 28 using heights acquired by the laser profiler 108 (shown in FIG. 2). In this respect the susceptor 28 may be rotated R about the rotation axis 66 while the laser profiler 108 is supported at susceptor mount 362. As the susceptor 28 rotates it is contemplated that the laser profiler 108 acquire height of the laser profiler 108 relative to the susceptor 28 at two or more rotary positions about the rotation axis 66, and the controller 122 determines wobble of the susceptor 28 by determining a height differential between heights of the susceptor 28 at the two or more rotary positions. In certain examples, wobble of the susceptor 28 may be displayed on the user interface 130 by change in a portion of the line 76 displaying height of the laser profiler 108 above the susceptor 28 during rotation R of the susceptor 28 about the rotation axis 66, simplifying analysis of wobble of the susceptor 28 by a user. The wobble may be determined continuously during rotation of the susceptor 28 about the rotation axis 66, improving wobble determination through acquisition of a differential in the width 78 of the circumferential gap 68 during 360-degrees or more of rotation about rotation axis 66.

In further examples, determining position of the susceptor 28 may include determining centering of the susceptor 28 using heights acquired by the laser profiler 108 (shown in FIG. 2). In this respect the differential in the width 78 of the circumferential gap 68 may be determined with the susceptor 28 in the both the first rotary position and the second rotary position. Centering may be determined using the differential in the width 78 at both the first rotary position and the second rotary position. In certain examples, gap width may be determined while the susceptor is rotated about the rotation axis 66 and runout determined from the gap width during rotation R of the susceptor about the rotation axis 66. In further examples, runout of the susceptor 28 may be displayed on the user interface 130 by change in a portion of the line 76 projected into the circumferential gap 68 during rotation R of the susceptor 28 about the rotation axis 66, simplifying analysis of runout of the susceptor 28 by a user. Runout of the susceptor 28 may be determined continuously during rotation of the susceptor 28 about the rotation axis 66, improving runout determination through acquisition of the differential in the width 78 of the circumferential gap 68 by 360-degrees or more of rotation about rotation axis 66.

Figure 9:
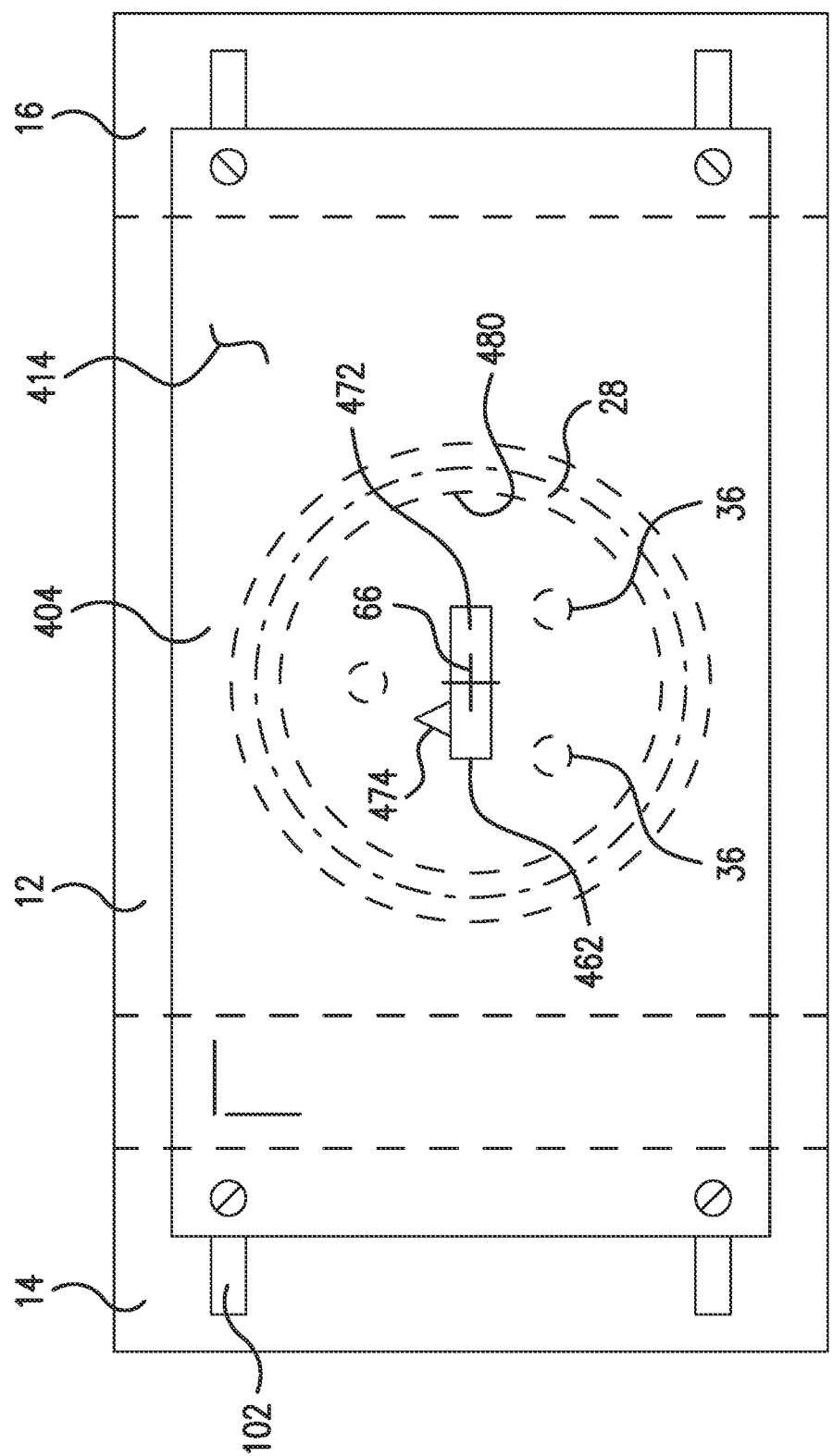
FIG. 9 is a plan view of the reaction chamber and a portion of the fixture of FIG. 1 including the leveling plate, schematically showing a wafer center mount located on the leveling plate and overlaying a wafer positioned within the reaction chamber.
Figure 10:
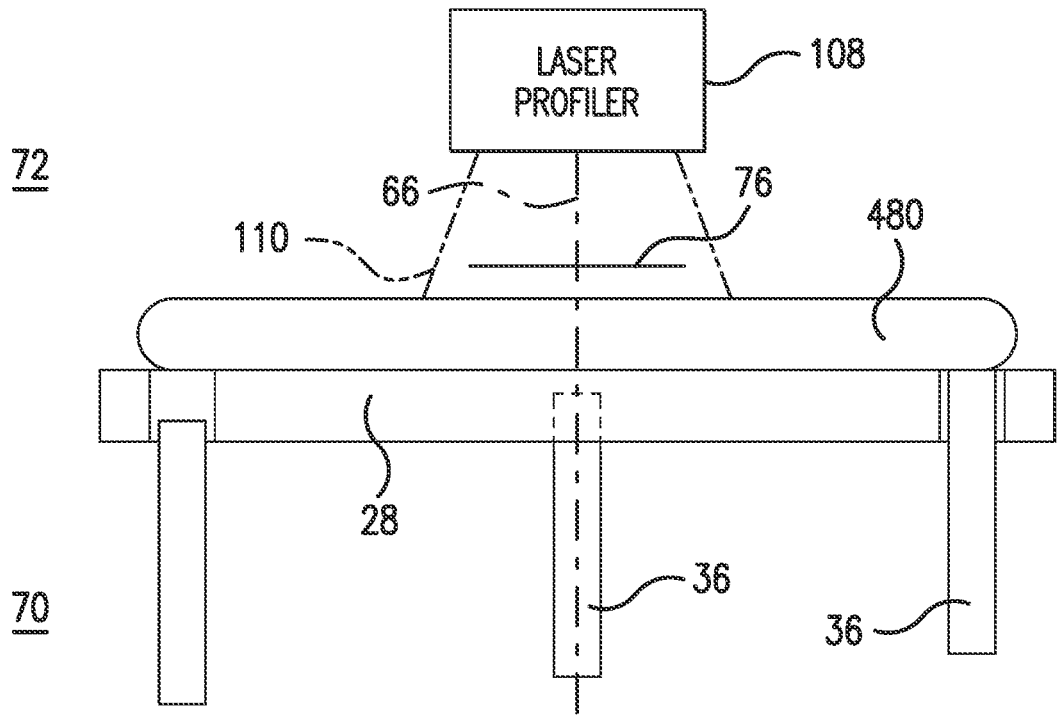
FIGS. 10 and 11 are side views of the reaction chamber and fixture of FIG. 9, schematically showing the laser profiler acquiring height measurements of the laser profiler above the wafer to determine contact height of lift pins positioned within the reaction chamber.
Figure 11:
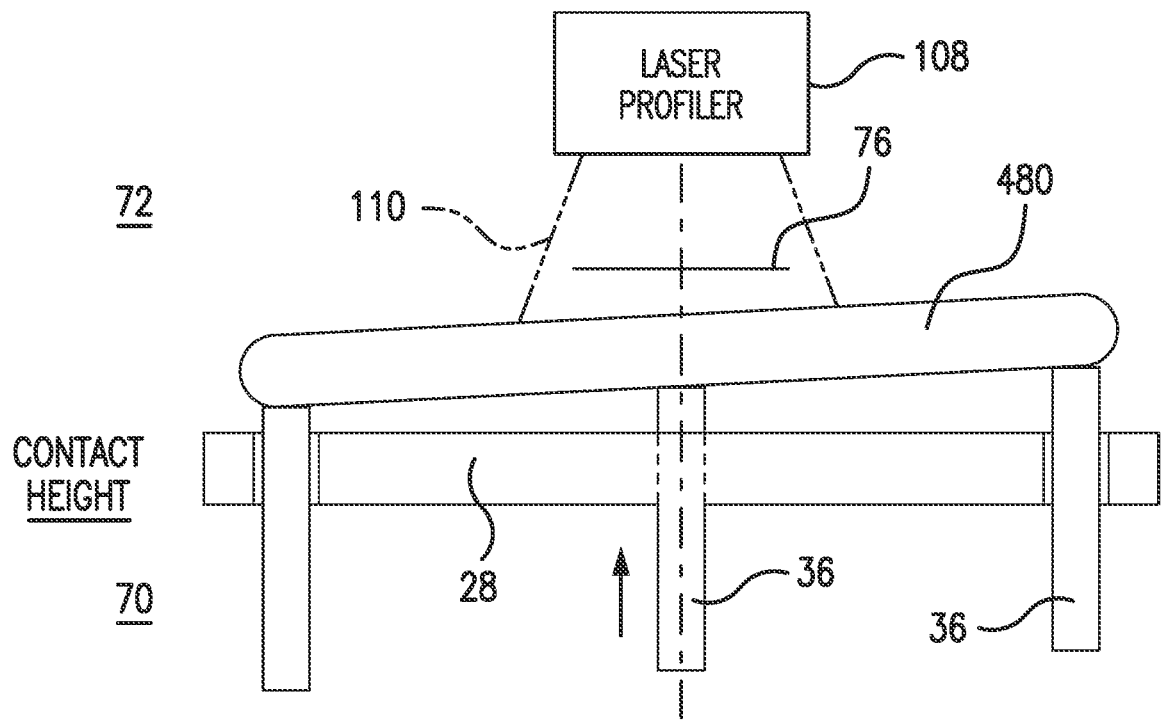

With reference to FIGS. 9-11, the fixture 100 is shown according to an example including a leveling plate 404. As shown in FIG. 9, the leveling plate 404 is similar to the leveling plate 104 (shown in FIG. 2) and additionally has a mounting surface 414 with a wafer center mount 462. The wafer center mount 462 is configured for determining contact height of the plurality of lift pins 36 and in this respect includes a wafer center mount aperture 472 and a wafer center mount registration feature 474.

The wafer center mount registration feature 474 is configured to fix the bracket 106 on the mounting surface 414 and is located on the mounting surface 414 at a location adjacent to the wafer center mount aperture 472. The wafer center mount aperture 472 extends through the leveling plate 404 at a location that, when the leveling plate 404 is supported on the frame 102 and overlays the reaction chamber 12, is registered to the rotation axis 66. The registration is such that seating the bracket 106 (shown in FIG. 2) on the wafer center mount 462 causes the field of view 110 (shown in FIG. 2) of the laser profiler 108 (shown in FIG. 2) to extend into the reaction chamber 12 through both the leveling plate 404 and the frame 102. It is further contemplated that the field of view 110 overlay a central portion of a wafer seated on the susceptor 28, e.g., a test wafer 480, such that the laser profiler 108 may acquire height of the laser profiler 108 relative to the test wafer 480 to determine contact height of the lift pins 36.

As shown in FIG. 10, to determine lift pin contact height, the plurality of lift pins 36 are first moved from the extended position 72 to the retracted position 70. Movement of the lift pins 36 to the retracted position 70 seats the test wafer 480 on the susceptor 28 such that the center portion of the test wafer 480 is in the field of view 110 of the laser profiler 108. Once the test wafer 480 is seated on the susceptor 28, the laser profiler 108 projects the line 76 onto the center portion of the test wafer 480 and acquires height of the laser profiler 108 relative to the center portion of the test wafer 480. Height of the laser profiler 108 relative to the center portion of the test wafer 480 is communicated to the controller 122 (shown in FIG. 2), which determines position of the test wafer 480 using the height acquired by the laser profiler 108. In certain examples, the laser profiler 108 may acquire a plurality of heights continuously, e.g., sequentially and separated by a predetermined time interval. It is contemplated that the controller 122 in turn determine contact height by comparing heights received from the laser profiler 108 with a prior-acquired height and determine contact height according to differential between an acquired height and the prior-acquired height.

As shown in FIG. 11, the lift pins 36 are next driven from the retracted position 70 toward the extended position 72. As will be appreciated by those of skill in the art in view of the present disclosure, driving the lift pins 36 toward the extended position 72 causes the lift pins 36 to displace the test wafer 480 from the susceptor 28 when movement of the lift pins 36 is such that the lift pins 36 come into contact the underside of the test wafer 480. It is contemplated that the controller 122 (shown in FIG. 2) determine the lift pin height at which the lift pins 36 contact the wafer 480 by comparing each successive height measurement received from the laser profiler 108 with the prior-acquired height comparing height measurement received after the lift pins 36 contact the underside of the test wafer 480.

In certain examples, determined contact height may be used to control movement of the lift pins during placement of wafers thereafter on the susceptor 28. For example, speed of the lift pins 36 may thereafter be slowed during movement from the extended position 72 to the retracted position 70 as the lift pins approach the lift pin contact height, limiting (or eliminating) the tendency wafers, e.g., the wafer 64, to otherwise decenter during seating against the susceptor 28 during loading. Alternatively (or additionally), speed of the lift pins 36 may be slowed during movement of the lift pins 36 during movement from the retracted position 70 to the extended position 72, limiting (or eliminating) the risk of wafer damage, e.g., the wafer 64 (shown in FIG. 1), due to lift pin contact during unloading of wafers from the susceptor 28. Advantageously, the determined lift pin contact height may be relatively accurate due to the use of the line 76, e.g., by acquiring height of laser profiler 108 above the center of the test wafer 480 at opposite ends of the line 76 in the field of view 110 of the laser profiler 108, in examples where level of the lift pins 36 differs from level of the susceptor 28.

With reference to FIGS. 12-14, the fixture 100 is shown according to an example including a leveling plate 504. As shown in FIG. 12, the leveling plate 504 is similar to the leveling plate 104 (shown in FIG. 2) and additionally has a mounting surface 514 with a first wafer periphery mount 562 and at least one second wafer periphery mount 576. The first wafer periphery mount 562 and the second wafer periphery mount 576 are each configured for determining level of the plurality of lift pins 36 using measurements of height of the laser profiler 108 (shown in FIG. 2) relative to a periphery of a wafer, e.g., the test wafer 480, positioned within the reaction chamber 12 between the susceptor 28 and the laser profiler 108.

The first wafer periphery mount 562 includes a first wafer periphery mount aperture 572 and a first wafer periphery mount registration feature 574. The first wafer periphery mount registration feature 574 is configured to register and fix the bracket 106 (shown in FIG. 2) on the mounting surface 514 and is adjacent to the first wafer periphery mount aperture 572. The first wafer periphery mount aperture 572 extends through the leveling plate 504 at a location that, when the leveling plate 504 is supported on the frame 102 above the reaction chamber 12, overlays a periphery of the test wafer 480. Registration of the first wafer periphery mount aperture 572 with the periphery of the wafer 480 causes the periphery the test wafer 480 to be in the field of view 110 (shown in FIG. 2) of the laser profiler 108 (shown in FIG. 2) when the bracket 106 is seated on the first wafer periphery mount 562. Placement of the periphery of the test wafer 480 in the field of view 110 of the laser profiler 108 enables the laser profiler 108 to acquire height measurements of the periphery of the test wafer 480 from the first wafer periphery mount 562 by projecting the line 76 (shown in FIG. 5) onto the periphery of the test wafer 480.

The second wafer periphery mount 576 is similar to the first wafer periphery mount 562 and is additionally offset from the first wafer periphery mount 562 about the rotation axis 66. In this respect the second wafer periphery mount registration feature 580 is configured to register and fix the bracket 106 (shown in FIG. 2) on the mounting surface 514 at a location adjacent to the second wafer periphery mount aperture 578. The second wafer periphery mount aperture 578 extends through the leveling plate 504 at a location that, when the leveling plate 504 is supported on the frame 102 above the reaction chamber 12, overlays the periphery of the test wafer 480 at a location circumferentially offset from the first wafer periphery mount aperture 572 about the rotation axis 66. Registration of the second wafer periphery mount aperture 578 with the periphery of the test wafer 480 also causes the periphery of the test wafer 480 to be in the field of view 110 (shown in FIG. 2) of the laser profiler 108 (shown in FIG. 2) when the bracket 106 is seated on the second wafer periphery mount 576. As will be appreciated by those of skill in the art in view of the present disclosure, placement of the periphery of the test wafer 480 in the field of view 110 of the laser profiler 108 also enables the laser profiler 108 to acquire height measurements of the periphery of the test wafer 480 from the second wafer periphery mount 576 by projecting the line 76 onto the periphery of the test wafer 480.

As shown in FIG. 13, to determine level of the plurality of lift pins 36, the test wafer 480 is supported on the susceptor 28 and the bracket 106 seated on the first wafer periphery mount 562. Next, the lift pins 36 driven from the retracted position 70 to the extended position 72. As the lift pins 36 move between the retracted position 70 and the extended position 72 the laser profiler 108 continuously acquires height measurements of the laser profiler 108 relative to the periphery of the test wafer 480 from the first wafer periphery mount 562. As the lift pins 36 contact the underside of the test wafer 480 and displace the test wafer 480 from the susceptor 28 the height measurements acquired by the laser profiler 108 change, height measurements thereafter becoming smaller as the lift pins reach the extended position 72. In certain examples, the height measurements are communicated to the controller 122, and the lift pin contact height reflected in the change in height identified as a first lift pin contact height.

As shown in FIG. 14, the lift pins 36 are next returned to the retracted position 70 such that the test wafer 480 is again seated on the susceptor 28, the bracket 106 (shown in FIG. 2) removed from the first wafer periphery mount 562 and seated on the second wafer periphery mount 576, and the lift pins 36 again driven from the retracted position 70 and the extended position 72. As the lift pins 36 are driven between the retracted position 70 and the extended position 72 the laser profiler 108 acquires height measurements of the laser profiler 108 relative to the periphery of the test wafer 480 from the second wafer periphery mount 576. As above, it is contemplated that the height measurements be communicated to the controller 122, and that the controller 122 identify the lift pin contact height at which the acquired height measurements change as a second lift pin contact height. As will be appreciated by those of skill in the art in view of the present disclosure, the second lift pin contact height may differ from the first lift pin contact height according difference in level between the mounting surface 514 and the plurality of lift pins 36.

To determine lift pin level, the first lift pin contact height is compared to the second lift pin contact height, e.g. by calculating a difference between the first lift pin contact height and the second lift pin contact height, and position of the lift pins 36 be determined with respect to level. In certain examples, the lift pin level may be compared to a predetermined lift pin level limit. In accordance with certain examples, level of the lift pins 36 may be adjusted when the lift pin level exceeds the predetermined lift pin level. As will be appreciated by those of skill in the art in view of the present disclosure, limiting deviation of the level of the lift pins 36 from level of the susceptor 28 may limit (or eliminate) the tendency of the level of the lift pins 36 to decenter wafers during seating on the susceptor 28, e.g., the wafer 64 (shown in FIG. 1), reducing (or eliminating) variation otherwise associated with such decentering.

In certain examples, the second wafer periphery mount 376 may be circumferentially offset from the first wafer periphery mount 562 about the rotation axis 66 by 180-degrees. In accordance with certain examples, the second wafer periphery mount 576 may be circumferentially offset from the first wafer periphery mount 562 about the rotation axis 66 by 90-degrees. Although shown and described herein as having the first wafer periphery mount 562 and the second wafer periphery mount 576, it is to be understood and appreciated that examples of the mounting plate may have more than two (2) wafer periphery mounts, e.g., four (4) wafer periphery mounts distributed circumferentially about the rotation axis and remain within the scope of the present disclosure. In such examples lift pin contact heights may be acquired at each of the wafer periphery mounts, a lift pin contact height total indicated range (TIR) determined using the lift pin contact heights, and the lift pin contact height TIR compared with the predetermined lift pin limit for purposes of determining level of the plurality of lift pins 36.

With reference to FIG. 15, the method 600 of determining position of a target within a reaction chamber, e.g., position of the target 74 (shown in FIG. 2) of the reaction chamber 12 (shown in FIG. 1), is shown. The method 600 includes leveling a leveling plate supported above the reaction chamber relative to gravity, e.g., the leveling plate 104 (shown in FIG. 2), as shown with box 610. The method 600 also includes projecting a line, e.g., the line 76 (shown in FIG. 5), into the reaction into the reaction chamber and onto the target using a laser profiler, e.g., the laser profiler 108 (shown in FIG. 2), as shown with box 620. Height of the laser profiler about the target is acquired at a first point and a second point along the line, e.g., the first point 50 (shown in FIG. 5) and the second point 52 (shown in FIG. 5), as shown with box 632. It is contemplated that the second point be spaced apart from the first point along the line.

As shown with box 640, position of the target is determined using the height of the profiler relative to the target. In certain examples, height and/or level of a shelf located within the reaction chamber may be determined, e.g., height and/or level of the shelf 24 (shown in FIG. 1), as shown with box 642. In accordance with certain examples, height and/or level of a one-piece ring may be determined, e.g. height and/or level of the one-piece ring 26 (shown in FIG. 1), as shown with box 644. In further examples, one or more of height, level, centering, wobble, and/or runout of a susceptor may be determined using the heights acquired by the laser profiler, e.g., height, level, and centering of the susceptor 28 within the one-piece ring 26, as shown with box 646. Wobble and/or runout of the susceptor 28 (shown in FIG. 1) may further be determined using the heights acquired by the laser profiler, as further shown with box 646. It is also contemplated that either of lift pin contact height and/or level may be determined using the heights acquired by the laser profiler, e.g., contact height and/or level of the lift pins 36 (shown in FIG. 1), as shown with box 648.

As shown with box 650, the determined position of the target may be compared to a predetermined target limit. It is contemplated that the target position may be accepted when the position is within the predetermined limit, as shown with arrow 680 and box 670. It is also contemplated that the target may be adjusted when the position of the target exceeds the predetermined limit, as shown with box 660. The position of the target and/or of other targets may be checked subsequent to adjustment of the target, as shown with arrow 690.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

ELEMENT LISTING

10 Semiconductor Processing System
12 Reactor
14 Injection Flange
16 Exhaust Flange
18 First Precursor Source
20 Second Precursor Source
22 Purge Source
24 Shelf
26 One-Piece Ring
28 Susceptor
30 Spider
32 Shaft
34 Drive Module
36 Lift Pins
38 Injection end
40 Exhaust End
42 Interior
44 First Precursor
46 Second Precursor
48 Purge Gas
50 First Point
52 Second Point
54 Upper Chamber
56 Lower Chamber
58 Lateral Joint
60 One-Piece Ring Aperture
62 Film
64 Wafer
66 Rotation Axis
68 Circumferential Gap
70 Retracted Position
72 Extended Position
74 Target
76 Line
78 Width of Circumferential Gap
80 First Rotary Position
82 Second Rotary Position
100 Fixture
102 Frame
104 Leveling Plate
106 Bracket
108 Laser Profiler
110 Field of View
112 First Level
114 Mounting Surface
116 Second Level
118 First Leveling Screw
120 Second Leveling Screw
122 Controller
124 Processor
126 Memory
128 Device Interface
130 User Interface 132 Wired Link
134 Program Modules
136 First Stringer
138 Second Stringer
140 Plurality of Joists
142 Frame Aperture
144 U-Shaped Body
146 End Cap
148 Cable Passthrough
149 Cable
150 Upper Tine
152 Lower Tine
154 Web
156 Profiler Seat
158 Bracket Seat
160 Bracket Aperture
162 First Shelf Mount
164 Laser Source
166 Expansion Lens
168 Collection Optics
170 Sensor
172 First Shelf Mount Aperture
174 First Shelf Mount Registration Feature
176 Second Shelf Mount
178 Second Shelf Mount Aperture
180 Second Shelf Mount Registration Feature
204 Leveling Plate
214 Mounting Surface
262 First One-Piece Ring Mount
272 First One-Piece Ring Mount Aperture
274 First One-Piece Ring Mount Registration Feature
276 Second One-Piece Ring Mount
278 Second One-Piece Ring Mount Aperture
280 Second One-Piece Ring Mount Registration Feature
304 Leveling Plate
314 Mounting Surface
362 First Susceptor Mount
372 First Susceptor Mount Aperture
374 First Susceptor Mount Registration Feature
376 Second Susceptor Mount
378 Second Susceptor Mount Aperture
380 Second Susceptor Mount Registration Feature
404 Leveling Plate
414 Mounting Surface
462 Wafer Center Mount
472 Wafer Center Mount Aperture
474 Wafer Center Mount Registration Feature
480 Test Wafer
504 Leveling Plate
514 Mounting Surface
562 First Wafer Periphery Mount
572 First Wafer Periphery Mount Aperture
574 First Wafer Periphery Mount Registration Feature
576 Second Wafer Periphery Mount
578 Second Wafer Periphery Mount Aperture
580 Second Wafer Periphery Mount Registration Feature
600 Method
610 Box
620 Box
622 Box
624 Box
626 Box
628 Box
630 Box
632 Box
640 Box
642 Box
644 Box
646 Box
648 Box
650 Box
660 Box
670 Box
680 Arrow
690 Arrow

The invention claimed is:

1. A fixture, comprising:
a frame configured for fixation above a reaction chamber, the reaction chamber configured to deposit a film onto a substrate;
a leveling plate supported on the frame;
a bracket supported on the leveling plate; and
a laser profiler suspended from the bracket and overlaying the reaction chamber, wherein the laser profiler has a field of view extending through the leveling plate and the frame to determine position of a target within the reaction chamber,
wherein the frame comprises:
a first stringer;
a second stringer offset from the first stringer; and
a plurality of joists extending between the first stringer and the second stringer, wherein the first stringer and the second stringer longitudinally span the reaction chamber.

2. A fixture, comprising:
a frame configured for fixation above a reaction chamber, the reaction chamber configured to deposit a film onto a substrate;
a leveling plate supported on the frame;
a bracket supported on the leveling plate; and
a laser profiler suspended from the bracket and overlaying the reaction chamber, wherein the laser profiler has a field of view extending through the leveling plate and the frame to determine position of a target within the reaction chamber,
wherein the bracket comprises a U-shaped body having a lower tine connected to an upper tine by a web, wherein the upper tine has a profiler seat extending along the upper tine, wherein the lower tine has a bracket seat extending along the lower tine, and wherein the bracket seat extends in parallel with the profiler seat.

3. The fixture of claim 2, wherein the bracket seat abuts the leveling plate, wherein the laser profiler is suspended from the profiler seat and above the lower tine of the U-shaped body.

4. The fixture of claim 2, further comprising:
an end cap with a cable passthrough fixed to ends of the upper tine and the lower tine opposite the web; and
a cable extending through the cable passthrough and electrically connected to the laser profiler to communicate height measurements acquired by the laser profiler.

5. A fixture, comprising:
a frame configured for fixation above a reaction chamber, the reaction chamber configured to deposit a film onto a substrate;
a leveling plate supported on the frame;
a bracket supported on the leveling plate;
a laser profiler suspended from the bracket and overlaying the reaction chamber, wherein the laser profiler has a field of view extending through the leveling plate and the frame to determine position of a target within the reaction chamber;

a first leveling screw threadedly received in the leveling plate and spacing the leveling plate apart from the frame; and at least one second leveling screw threadedly received in the leveling plate and spacing the leveling plate apart from the frame, the second leveling screw offset from the first leveling plate on a mounting surface of the leveling plate.

6. A fixture, comprising:
a frame configured for fixation above a reaction chamber, the reaction chamber configured to deposit a film onto a substrate;
a leveling plate supported on the frame;
a bracket supported on the leveling plate;
a laser profiler suspended from the bracket and overlaying the reaction chamber, wherein the laser profiler has a field of view extending through the leveling plate and the frame to determine position of a target within the reaction chamber;
a first level fixed to the leveling plate and extending longitudinally along a mounting surface of the leveling plate; and
a second level fixed to the leveling plate and extending laterally along the mounting surface of the leveling plate, the second level orthogonal relative to the first level.

7. A fixture, comprising:
a frame configured for fixation above a reaction chamber, the reaction chamber configured to deposit a film onto a substrate;
a leveling plate supported on the frame;
a bracket supported on the leveling plate; and
a laser profiler suspended from the bracket and overlaying the reaction chamber, wherein the laser profiler has a field of view extending through the leveling plate and the frame to determine position of a target within the reaction chamber;
wherein the laser profiler comprises:
  a laser source;
  an expansion lens optically coupled to the laser source, the expansion lens configured to widen a beam incident upon the expansion lens into a line and project the line onto the target;
  collection optics optically coupled to the expansion lens by the target; and
  a sensor optically coupled to the collection optics and configured to determine height of the laser profiler from the target along the line.

8. The fixture of claim 7, wherein the laser profiler includes one of a (a) a visible laser source, (b) a blue wavelength laser source, and (c) a 405-nanometer laser source.

9. The fixture of claim 7, wherein the bracket has a bracket aperture extending therethrough, wherein the expansion lens is aligned between the laser source and the bracket aperture to project the line onto the target, and wherein the collection optics are aligned between the bracket aperture and the sensor to collect and communicate illumination reflected from the target onto the sensor.

10. A fixture, comprising:
a frame configured for fixation above a reaction chamber, the reaction chamber configured to deposit a film onto a substrate;
a leveling plate supported on the frame;
a bracket supported on the leveling plate; and
a laser profiler suspended from the bracket and overlaying the reaction chamber, wherein the laser profiler has a field of view extending through the leveling plate and the frame to determine position of a target within the reaction chamber,
wherein the leveling plate comprises:
  a shelf mount with a shelf mount aperture and configured to seat the bracket;
  a one-piece ring mount with a one-piece ring mount aperture and configured to seat the bracket, the one-piece ring mount longitudinally offset from the shelf mount;
  a susceptor mount with a susceptor mount aperture and configured to seat the bracket, the susceptor mount longitudinally offset from the one-piece ring mount;
  a wafer center mount with a wafer center mount aperture and configured to seat the bracket, the wafer center mount aperture longitudinally offset from the susceptor mount; and
a wafer periphery mount with a wafer periphery mount aperture and configured to seat the bracket, the wafer periphery mount aperture radially offset from the wafer center mount.

11. A semiconductor processing system, comprising:
a reaction chamber;
a shelf fixed within an interior of the reaction chamber;
a one-piece ring positioned within the reaction chamber and abutting the shelf, the one-piece ring having a one-piece ring aperture extending therethrough;
a susceptor supported within the interior of the reaction chamber for rotation about a rotation axis, the rotation axis extending through the one-piece ring aperture; and
a fixture comprising:
  a frame configured for fixation above a reaction chamber, the reaction chamber configured to deposit a film onto a substrate;
  a leveling plate supported on the frame;
  a bracket supported on the leveling plate; and
  a laser profiler suspended from the bracket and overlaying the reaction chamber, wherein the laser profiler has a field of view extending through the leveling plate and the frame to determine position of a target within the reaction chamber,
wherein the frame supports the leveling plate above the reaction chamber such that at least one of the shelf, the one-piece ring, the susceptor, or a wafer positioned between the susceptor and the leveling plate is in the field of view of the laser profiler.

* * * * *